(12) United States Patent
Min et al.

(10) Patent No.: US 12,359,124 B2
(45) Date of Patent: *Jul. 15, 2025

(54) QUANTUM DOTS, AND ELECTRONIC DEVICES AND ELECTRONIC EQUIPMENTS INCLUDING SAME

(71) Applicant: SAMSUNG ELECTRONICS CO., LTD., Suwon-si (KR)

(72) Inventors: Jihyun Min, Seoul (KR); Soo Kyung Kwon, Suwon-si (KR); Seon-Yeong Kim, Suwon-si (KR); Yong Wook Kim, Yongin-si (KR); Ji-Yeong Kim, Suwon-si (KR); Eun Joo Jang, Suwon-si (KR); Sungwoo Hwang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/204,465

(22) Filed: Jun. 1, 2023

(65) Prior Publication Data

US 2023/0303924 A1 Sep. 28, 2023

Related U.S. Application Data

(63) Continuation of application No. 17/186,434, filed on Feb. 26, 2021, now Pat. No. 11,702,593.

(30) Foreign Application Priority Data

Feb. 28, 2020 (KR) .................. 10-2020-0025613

(51) Int. Cl.
| | |
|---|---|
| C09K 11/88 | (2006.01) |
| B82Y 20/00 | (2011.01) |
| B82Y 40/00 | (2011.01) |
| C09K 11/02 | (2006.01) |
| F21V 8/00 | (2006.01) |
| G02F 1/1335 | (2006.01) |
| H10K 50/115 | (2023.01) |
| H10K 59/38 | (2023.01) |

(52) U.S. Cl.
CPC ............ C09K 11/883 (2013.01); C09K 11/02 (2013.01); H10K 50/115 (2023.02); H10K 59/38 (2023.02); *B82Y 20/00* (2013.01); *B82Y 40/00* (2013.01); *G02B 6/005* (2013.01); *G02F 1/133614* (2021.01); *G02F 2202/36* (2013.01)

(58) Field of Classification Search
CPC .... C09K 11/883; C09K 11/02; H10K 50/115; G02F 1/133614
See application file for complete search history.

(56) References Cited

U.S. PATENT DOCUMENTS

| | | |
|---|---|---|
| 7,621,997 B2 | 11/2009 | Jun et al. |
| 7,964,278 B2 | 6/2011 | Banin et al. |
| 8,343,576 B2 | 1/2013 | Banin et al. |
| 9,138,711 B2 | 9/2015 | Treadway et al. |
| 10,170,648 B2 | 1/2019 | Jun et al. |
| 10,950,741 B2 | 3/2021 | Jun et al. |
| 11,661,526 B2 | 5/2023 | Pousthomis et al. |
| 11,702,593 B2 * | 7/2023 | Min ...................... C09K 11/02 257/13 |
| 11,753,589 B2 | 9/2023 | Min et al. |
| 2009/0230382 A1 | 9/2009 | Banin et al. |
| 2013/0092221 A1 | 4/2013 | De Moura Dias Mendes et al. |
| 2015/0214402 A1 | 7/2015 | Yoshikawa et al. |
| 2015/0218444 A1 * | 8/2015 | Kang ................... H01L 33/56 252/519.34 |
| 2017/0059988 A1 | 3/2017 | Paek et al. |
| 2018/0327665 A1 | 11/2018 | Lee et al. |
| 2019/0002719 A1 | 1/2019 | Pousthomis et al. |
| 2019/0002759 A1 | 1/2019 | D'Amico et al. |
| 2019/0040313 A1 | 2/2019 | Pousthomis et al. |
| 2020/0131435 A1 | 4/2020 | Pousthomis et al. |
| 2021/0167228 A1 | 6/2021 | Jun et al. |

FOREIGN PATENT DOCUMENTS

| | | |
|---|---|---|
| CN | 108441221 A | 8/2018 |
| CN | 108929691 A | 12/2018 |
| EP | 2336409 A2 | 6/2011 |
| KR | 101159853 B1 | 6/2012 |
| KR | 101374512 B1 | 3/2014 |
| KR | 20140056500 A | 5/2014 |

(Continued)

OTHER PUBLICATIONS

Changhyun Jin et al., "Influence of ZnO coating and annealing on the photoluminescence properties of larva-like gallium sulfide nanostructures," Current Applied Physics, Jan. 20, 2013, pp. S127-S130, vol. 13.
M. Mosaferi et al., "Direct band gap in gallium sulfide nanostructures," Materials Science, Oct. 27, 2018, pp. 1-8.
Peter M. Ndangili et al., "Gallium-Induced Perturbation of Zinc Selenide Quantum Dots Electronics," Materials Science inc. Nanomaterials & Polymers, 2017, pp. 7054-7062, vol. 2.
Shuming Yang et al., "The synthesis and optical properties of GaSe/InSe core/shell nanoparticles," Journal of Photochemistry and Photobiology A: Chemistry, May 18, 2007, pp. 159-165, vol. 192.
Sungwoo Kim et al., "Highly Luminescent InP/GaP/ZnS Nanocrystals and Their Application to White Light-Emitting Diodes," Journal of the American Chemical Society, Feb. 3, 2012, pp. 3804-3809, vol. 134.

(Continued)

*Primary Examiner* — C Melissa Koslow
(74) *Attorney, Agent, or Firm* — CANTOR COLBURN LLP

(57) ABSTRACT

A quantum dot including a core and a shell disposed on an outer surface of the core. The core includes a first semiconductor nanocrystal including a Group II-VI compound. The shell includes a second semiconductor nanocrystal. An effective mass of the second semiconductor nanocrystal is about 0.5 times to about 2.0 times an effective mass of the first semiconductor nanocrystal and the quantum dot does not include cadmium, lead, mercury, or a combination thereof.

20 Claims, 8 Drawing Sheets

(56) References Cited

FOREIGN PATENT DOCUMENTS

| KR | 101563878 B1 | 10/2015 |
| KR | 101586875 B1 | 1/2016 |
| KR | 101797366 B1 | 11/2017 |
| KR | 20180124765 A | 11/2018 |
| KR | 20190068242 A | 6/2019 |
| WO | 2018220160 A1 | 12/2018 |
| WO | 2018220163 A1 | 12/2018 |
| WO | 2018220165 A1 | 12/2018 |
| WO | 2018220167 A1 | 12/2018 |

OTHER PUBLICATIONS

Taro Uematsu et al., "Narrow band-edge photoluminescence rom AgInS2 semiconductor nanoparticles by the formation of amorphous III-VI semiconductor shells," NPG Asia Materials, Aug. 7, 2018, pp. 1-14.

Notice of Allowance dated Mar. 20, 2025 of the corresponding Korean Patent Application No. 10-2021-0026930.

\* cited by examiner

QUANTUM DOTS, AND ELECTRONIC DEVICES AND ELECTRONIC EQUIPMENTS INCLUDING SAME

CROSS-REFERENCE TO RELATED APPLICATION

This application is a continuation application of application Ser. No. 17/186,434, filed Feb. 26, 2021, now U.S. Pat. No. 11,702,593, which claims priority to and the benefit of Korean Patent Application No. 10-2020-0025613 filed in the Korean Intellectual Property Office on Feb. 28, 2020, and all the benefits accruing therefrom under 35 U.S.C. § 119, the content of which in its entirety is herein incorporated by reference.

BACKGROUND

1. Field

Quantum dots, and electronic devices and electronic devices including the same are disclosed.

2. Description of the Related Art

Physical characteristics (e.g., bandgap energies, melting points, etc.) of nanoparticles that are intrinsic characteristics may be controlled by changing particle sizes of the nanoparticles, unlike bulk materials. For example, semiconductor nanocrystal particles also referred to as quantum dots are a crystalline material having a size of several nanometers. Such semiconductor nanocrystal particles have such a small size that they have a large surface area per unit volume and exhibit quantum confinement effects, and thus have different properties from the characteristics of bulk materials having the same composition. Quantum dots may absorb light from an excitation source to be excited, and may emit energy corresponding to bandgap energies of the quantum dots.

SUMMARY

An embodiment provides heavy metal-free quantum dots capable of implementing improved optical properties (e.g., luminous efficiency, full width at half maximum (FWHM)).

An embodiment provides a quantum dot polymer composite including the aforementioned heavy metal-free quantum dots.

An embodiment provides an electronic device and an electronic equipment including the aforementioned heavy metal-free quantum dots.

Core-shell quantum dot(s) (hereinafter, also referred to as quantum dots) according to an embodiment includes a core including a first semiconductor nanocrystal including Group II-VI compound and a shell disposed on the outer surface of the core and including a second semiconductor nanocrystal, wherein the quantum dots do not include cadmium, lead, mercury, or a combination thereof. An effective mass of the second semiconductor nanocrystal may be about 0.5 times to about 2.0 times an effective mass of the first semiconductor nanocrystal.

The effective mass of the second semiconductor nanocrystal may be about 0.6 times or more, or about 0.8 times or more, and about 1.5 times or less, or about 1.2 times or less of the effective mass of the first semiconductor nanocrystal. The second semiconductor nanocrystal may have an electron effective mass of less than about 0.39 $m_e$, less than or equal to about 0.34 $m_e$, less than or equal to about 0.30 $m_e$, less than or equal to about 0.25 $m_e$, or less than or equal to about 0.20 $m_e$. A difference between the electron effective mass of the second semiconductor nanocrystal and the first semiconductor nanocrystal may be less than or equal to about 0.2 $m_e$, less than or equal to about 0.15 $m_e$, less than or equal to about 0.1 $m_e$, or less than or equal to about 0.05 $m_e$. A difference between the hole effective mass of the second semiconductor nanocrystal and the first semiconductor nanocrystal may be less than or equal to about 1.5 $m_e$, less than or equal to about 1.0 $m_e$, less than or equal to about 0.7 $m_e$, less than or equal to about 0.5 $m_e$, or less than or equal to about 0.3 $m_e$.

A bandgap energy of the second semiconductor nanocrystal may be greater than a bandgap energy of the first semiconductor nanocrystal. For example, the bandgap energy of the second semiconductor nanocrystal may be greater than 1.0 times, for example, about 3.0 times or less, about 2.5 times or less, about 2.0 times or less, or about 1.5 times or less the bandgap energy of the first semiconductor nanocrystal.

A mole ratio of the Group III element to the Group II element included in the quantum dot may be greater than about 0:1 and less than or equal to about 10:1. The mole ratio of the Group III element to the Group II element included in the quantum dot may be greater than about 0:1 and less than or equal to about 1:1, or greater than about 0:1 and less than or equal to about 0.5:1. A mole ratio of the Group III element included in the quantum dot to the Group II element of the core may be greater than about 0:1 and less than or equal to about 10:1.

A mole ratio of the Group III element to the Group VI element included in the quantum dot may be greater than about 0:1 and less than or equal to about 10:1. A mole ratio of the Group III element included in the quantum dot to the Group VI element of the core may be greater than about 0:1 and less than or equal to about 10:1.

The second semiconductor nanocrystal may include gallium (Ga). The second semiconductor nanocrystal may include gallium (Ga) chalcogenide. The second semiconductor nanocrystal may include a compound represented by $M^1X^1$, wherein $M^1$ is In, Ga, or a combination thereof and $X^1$ is S, Se, Te, or a combination thereof. The second semiconductor nanocrystal may include a compound represented by Chemical Formula 1.

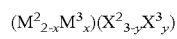   Chemical Formula 1

In Chemical Formula 1, $M^2$ and $M^3$ are independently In, Ga, or a combination thereof, and $X^2$ and $X^3$ are independently S, Se, Te, or a combination thereof, x is in the range of greater than 0 and less than or equal to 2, and y is in the range of greater than or equal to 0 and less than or equal to 3.

The quantum dot may further include a, e.g., at least one, shell including a third semiconductor nanocrystal. The third semiconductor nanocrystal may include a Group II-VI compound, a Group III-V compound, or a combination thereof. The third semiconductor nanocrystal may include ZnSe, ZnTeSe, ZnSeS, ZnTeS, ZnS, InP, InGaP, InAs, InGaAs, or a combination thereof.

The shell including the third semiconductor nanocrystal may be disposed outside the shell including the second semiconductor nanocrystal, between the core and the shell including the second semiconductor nanocrystal, or both. When the shell including the third semiconductor nanocrystal is disposed between the core and the shell including the second semiconductor nanocrystal, a shell, e.g., one or more shells, including a Group II-VI compound (e.g., the shell including the zinc chalcogenide compound) may be present. When two or more shells including a Group II-VI compound are present, the composition of the Group II-VI compound may be different or the same. Among the two or more shells including the Group II-VI compound, a shell closest to the core may include Se, and a shell farthest from the core may include S.

The first semiconductor nanocrystal may include a zinc chalcogenide compound. The first semiconductor nanocrystal may include zinc, and may include selenium, tellurium, sulfur, or a combination thereof. The first semiconductor nanocrystal may include all of zinc, selenium, and tellurium.

In the first semiconductor nanocrystal, a mole ratio (Te:Se) of tellurium to selenium may be greater than about 0:1 and less than or equal to about 10:1.

The mole ratio (Te:Se) of tellurium to selenium included in the quantum dot may be greater than about 0:1 and less than or equal to about 5:1.

A mole ratio (Te:Zn) of tellurium to zinc included in the quantum dot may be greater than about 0:1 and less than or equal to about 10:1.

A maximum emission peak of the quantum dot may exist in a wavelength range of greater than or equal to about 400 nanometers (nm) and less than or equal to about 1,600 nm. The maximum emission peak of the quantum dot may be greater than or equal to about 420 nm and less than about 500 nm, greater than or equal to about 500 nm and less than or equal to about 580 nm, or greater than or equal to about 600 nm and less than or equal to about 700 nm.

A full width at half maximum (FWHM) of the maximum emission peak of the quantum dot may be less than or equal to about 40 nm, or less than or equal to about 35 nm.

The quantum dots may have a quantum efficiency of greater than or equal to about 40%, greater than or equal to about 50%, greater than or equal to about 55%, greater than or equal to about 60%, greater than or equal to about 65%, greater than or equal to about 70%, greater than or equal to about 80%, greater than or equal to about 85%, greater than or equal to about 90%, or greater than or equal to about 95%.

In quantum dots, a lattice mismatch between the first semiconductor nanocrystal and the second semiconductor nanocrystal may be less than or equal to about 20%, or less than or equal to about 15%.

Quantum dots according to an embodiment do not include cadmium, lead, mercury, or a combination thereof, and include a semiconductor compound having an electron effective mass of less than or equal to about 0.34 $m_e$ in a mole ratio of greater than or equal to about 0.3:1 and less than or equal to about 1:1 with respect to a total number of moles in the quantum dots. The semiconductor compound may be included in a mole ratio of greater than or equal to about 0.35:1, greater than or equal to about 0.4:1, greater than or equal to about 0.5:1, greater than or equal to about 0.6:1, or greater than or equal to about 0.8:1 with respect to a total number of moles in the quantum dots. The semiconductor compound may have an electron effective mass of less than or equal to about 0.30 $m_e$, less than or equal to about 0.25 $m_e$, or less than or equal to about 0.2 $m_e$, and greater than or equal to about 0.08 $m_e$, greater than about 0.08 $m_e$, greater than or equal to about 0.1 $m_e$, or greater than or equal to about 0.15 $m_e$.

The semiconductor compound having the electron effective mass of less than or equal to about 0.34 $m_e$ may include a Group II-VI compound, a Group III-V compound, a Group III-VI compound, or a combination thereof. The semiconductor compound having an electron effective mass of less than or equal to about 0.34 $m_e$ may include a Group II-VI compound and a Group III-VI compound (e.g., ZnTeSe and $Ga_2S_3$)).

The semiconductor compound having the electron effective mass of less than or equal to about 0.34 $m_e$ may include a compound represented by $M^4X^4$, wherein $M^4$ is Zn, Ga, or a combination thereof, and $X^4$ is S, Se, Te, or a combination thereof. The semiconductor compound having the electron effective mass of less than or equal to about 0.34 $m_e$ may not be a binary element compound of zinc sulfide.

The quantum dot may include a core including a semiconductor nanocrystal and n shells (n is an integer greater than or equal to 1) disposed outside the core. A shell, e.g., at least one of the n shells, may include a semiconductor compound having an electron effective mass of less than or equal to about 0.34 $m_e$. When n is greater than or equal to 2, a number m of the n shells may include a semiconductor compound having an electron effective mass of less than or equal to about 0.34 $m_e$, wherein m is an integer greater than or equal to n/2. The core may include the semiconductor compound having the electron effective mass of less than or equal to about 0.34 $m_e$. The core may include a zinc chalcogenide compound. The quantum dot may further include a shell including a binary element compound made of zinc sulfide as well as a shell including a semiconductor compound having an electron effective mass of less than or equal to about 0.34 $m_e$.

The quantum dot polymer composite includes a polymer matrix and quantum dots dispersed in the polymer matrix, and the quantum dots include the aforementioned quantum dots.

The polymer matrix may include a thiolene polymer, a (meth)acrylate polymer, a urethane-based resin, an epoxy-based resin, a vinyl-based polymer, a silicone resin, or a combination thereof.

The quantum dot polymer composite may further include metal oxide particulates.

The electronic device includes a first electrode, a second electrode facing the first electrode, and an active layer between the first electrode and the second electrode, and the active layer includes the aforementioned quantum dots.

The electronic device includes a light source and a light emitting element, the light emitting element includes the aforementioned quantum dots, and the light source is configured to provide incident light to the light emitting element. The incident light may have a photoluminescence peak wavelength in a range of greater than or equal to about 400 nm and less than or equal to about 500 nm. The light emitting element may include a quantum dot polymer composite.

Heavy metal-free quantum dots capable of emitting light of a desired wavelength (e.g., greater than about 400 nm) with improved quantum efficiency and reduced FWHM may be provided. Such heavy metal-free quantum dots capable of emitting light of a desired wavelength with improved quantum efficiency and reduced FWHM may be applied to, e.g., used in, various display devices and biological labeling (biosensors, bio-imaging), photodetectors, solar cells, hybrid composites, and the like.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
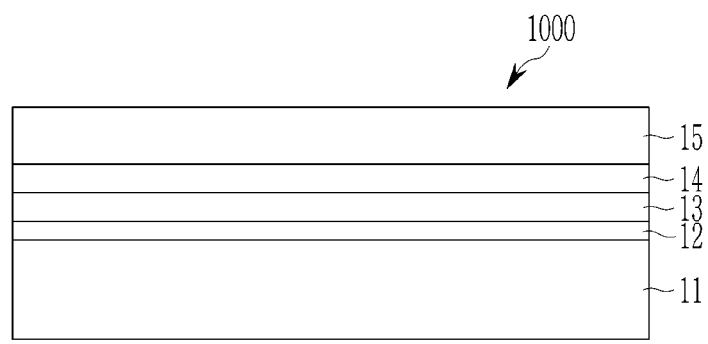
FIG. 1 is a schematic cross-sectional view of an electronic device (e.g., an electroluminescent device) according to an embodiment.

This disclosure will be described more fully hereinafter in the following detailed description, in which some but not all embodiments of this disclosure are described with reference to the attached drawings. This disclosure may be embodied in many different forms and is not be construed as limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

Further, the singular includes the plural unless mentioned otherwise. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to a compound or a moiety wherein at least one of hydrogen atoms thereof is replaced by a substituent such as a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(=NH)NH$_2$)), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, a hydrocarbon group refers to a group including carbon and hydrogen (e.g., an alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon group, at least one methylene may be replaced by an oxide moiety, a carbonyl moiety, an ester moiety, —NH—, or a combination thereof.

As used herein, when a definition is not otherwise provided, "alkyl" refers to a linear or branched saturated monovalent hydrocarbon group (methyl, ethyl hexyl, etc.).

As used herein, when a definition is not otherwise provided, "alkenyl" refers to a linear or branched monovalent hydrocarbon group having one or more carbon-carbon double bond.

As used herein, when a definition is not otherwise provided, "alkynyl" refers to a linear or branched monovalent hydrocarbon group having one or more carbon-carbon triple bond.

As used herein, when a definition is not otherwise provided, "aryl" refers to a group formed by removal of at least one hydrogen from an aromatic group (e.g., a phenyl or naphthyl group).

As used herein, when a definition is not otherwise provided, "hetero" refers to one including 1 to 3 heteroatoms of N, O, S, Si, P, or a combination thereof.

As used herein, when a definition is not otherwise provided, "Group" refers to a group of Periodic Table.

As used herein, when a definition is not otherwise provided "Group III" may include Group IIIA, and examples of Group III metals include, but are not limited to, In, Ga, and TI.

Semiconductor nanocrystal particles (hereinafter, referred to as quantum dots) may absorb light from an excitation source and may emit energy corresponding to a bandgap energy of the quantum dot. Bandgap energies of quantum dots may be changed according to sizes, compositions, or a combination thereof of quantum dots. For example, as the sizes of quantum dots increase, the quantum dots may have narrower, e.g., lower, bandgap energies and increased emission wavelengths. The semiconductor nanocrystal may be used as a light emitting material in various fields such as a display device, an energy device, or a bio light emitting device.

Many of the quantum dots having luminescent properties at the level of practical application are based on hazardous heavy metals such as cadmium (Cd), lead (Pb), mercury (Hg), or a combination thereof. Hazardous heavy metals such as cadmium pose a serious environmental/health problem, so environmentally-friendly quantum dots that are capable of emitting light of a desired wavelength while having improved luminescent properties are desirable. Among such environmentally-friendly quantum dots capable of emitting light of a desired wavelength while having improved luminescent properties, a quantum dot based on a Group III-V compound including indium (In) and phosphorus (P) in the core may be applicable in a device.

On the other hand, in order for a display using quantum dots to realize, e.g., exhibit, a high color reproducibility, quantum dots having a lower, e.g., smaller, full width at half maximum (FWHM) may be desired. However, quantum dots based on a Group III-V compound including indium (In) and phosphorus (P) in the core have a smaller, e.g., lower, bandgap energy and a larger bore radius than cadmium-based cores such as CdSe cores, so the change in FWHM according to the size of the core is large. In addition, since the core including indium and phosphorus is susceptible to surface oxidation, the FWHM of the core-shell quantum dot may be further increased compared with the core. Quantum dots based on Group III-V compound (e.g., InP) cores emit light of a desired wavelength (e.g., greater than about 470 nm, greater than or equal to about 475 nm, or greater than or equal to about 480 nm and less than or equal to about 580 nm) while emitting light at a reduced level of FWHM (e.g., less than or equal to about 40 nm, or less than or equal to about 35 nm) is difficult to implement.

On the other hand, heavy metal-free quantum dots including a Group II-VI compound in the core (e.g., quantum dots including zinc chalcogenide) theoretically have a wide bandgap and a narrow bore radius, so that the change in the bandgap according to the core size may be small. Accordingly, a heavy metal-free quantum dot including a Group II-VI compound in the core may have a larger size range and a smaller FWHM for emitting a predetermined wavelength range (e.g., a green light range) compared with a quantum dot based on an indium phosphide core.

However, in practice, in the case of a heavy metal-free quantum dot including a Group II-VI compound in the core (e.g., a quantum dot including zinc chalcogenide), quantum dots having luminescent properties with at least a predetermined efficiency while emitting light of a desired wavelength have not been reported. For example, when a quantum dot having a core of ZnTeSe emits light in a green wavelength range (e.g., light of greater than or equal to about 470 nm), a luminous efficiency of the quantum dot may be less than 1%.

The present inventors have confirmed that in a heavy metal-free core-shell quantum dot, a relative difference between the effective masses, e.g., the electron effective masses and/or hole effective masses, of the core and the shell affects quantum efficiency of the quantum dot.

The effective mass is an apparent mass of charge carriers (electrons or holes) in the crystal. The charge carriers in the crystal move similarly to free electrons in a vacuum. However, when accelerated by forces such as electric or magnetic fields, the charge carriers in the crystal move as if they have a different mass than usual. The mass at this time is called the effective mass (m*), and the effective mass may be calculated as follows through the relationship between the E-k energy band and the mass of the electron of the free electron, and may also be measured by experiment such as cyclotron resonance.

$$m^* = \pm \hbar^2 \left( \frac{d^2 E_k}{dk^2} \right)^{-1}$$

As a result of applying two compositions of shells (e.g., zinc sulfide and gallium sulfide) having different effective masses to a core of the same composition (e.g., zinc chalcogenide), when the effective mass of the shell composition is similar to that of the core composition (e.g., about 0.5 times to about 2.0 times of the effective mass of the core composition), high quantum efficiency may be exhibited.

In some cases, it has also been found that absolute values of effective masses of the core and the shell may have more influence than a difference in the bandgap energies between the core and the shell. In core-shell quantum dots, the higher the bandgap energy of the semiconductor nanocrystals constituting the shell than the bandgap of the semiconductor nanocrystals of the core, the higher a degree of electron-hole overlap in the core, which may increase the quantum efficiency of the quantum dots. However, as a result of applying two compositions of shells (e.g., zinc sulfide and gallium sulfide) having different effective masses to a core of the same composition (e.g., zinc chalcogenide), even though a difference between the bandgap energies between the core and the shell is smaller, a shell with a lower, e.g., smaller, effective mass value exhibits higher luminous efficiency.

In addition, it is confirmed that a proportion of semiconductor compounds having small effective mass (e.g., semiconductor compounds having electron effective mass of less than or equal to about 0.34 $m_e$ or less) in the composition of heavy metal-free quantum dots affects the quantum efficiency of quantum dots. As a result of confirming quantum dots of various compositions by applying shells of compounds having different effective masses (e.g., zinc selenide, zinc sulfide, or gallium sulfide) to a core (e.g., zinc chalcogenide) of the same composition, when a mole ratio of a compound having a small effective mass (e.g., a compound having an electron effective mass of less than or equal to about 0.34 $m_e$) is greater than or equal to about 0.3:1, high quantum efficiency may be exhibited.

It is confirmed that heavy metal-free quantum dots including a core including a Group II-VI compound (e.g., a core including zinc chalcogenide) and a shell including a Group III-VI compound (e.g., gallium chalcogenide) not only emit light of a desired wavelength, but also exhibit improved quantum efficiency.

Although not intending to be bound by a particular theory, it is believed that the core including the zinc chalcogenide compound makes it difficult to form a uniform shell as defects occur on the surface during the shell formation process. As a result, the produced quantum dots may have an increased trap(s) on the surface thereof or have an uneven shape or size distribution. However, the shell including a Group III-VI semiconductor compound (e.g., gallium chalcogenide) may passivate the core relatively evenly, thereby increasing the degree of electron-hole overlap in the quantum dot, decreasing surface defects, and providing quantum dots having a uniform shape or size distribution.

In addition, this improvement effect may be more remarkable when the core contains tellurium. Tellurium is more susceptible to oxidation than other chalcogen elements (selenium, sulfur) during the shell formation process, and as an amount of tellurium in the core increases, the prepared core-shell quantum dots may exhibit reduced luminescent properties. However, when a shell including a Group III-VI compound is included in a core having a high amount of tellurium, the luminescent properties of the final core-shell quantum dots may be remarkably improved, and the produced quantum dots may exhibit quantum efficiency of greater than or equal to about 40%. For example, when a shell including gallium chalcogenide is applied to, e.g., disposed on, a core having a composition of $ZnTe_xSe_{1-x}$ (x=about 0.3 or greater), quantum efficiency may be improved by about 1.2 times or more or about 1.5 times or more compared with the core.

According to an embodiment, the core-shell quantum dots do not include cadmium, lead, mercury, or a combination thereof, and may include a core including a first semiconductor nanocrystal including Group II-VI compound and a, e.g., at least one, shell disposed on the outer surface of the core and including a second semiconductor nanocrystal.

An effective mass of the second semiconductor nanocrystal is about 0.5 times to about 2.0 times of an effective mass of the first semiconductor nanocrystal.

The effective mass of the second semiconductor nanocrystal may be about 0.6 times or more, or about 0.8 times or more, and about 1.5 times or less, or about 1.2 times or less of the effective mass of the first semiconductor nanocrystal. A difference between the electron effective mass of the second semiconductor nanocrystal and the first semiconductor nanocrystal may be less than or equal to about 0.2 $m_e$, less than or equal to about 0.15 $m_e$, less than or equal to about 0.1 $m_e$, or less than or equal to about 0.05 $m_e$. In addition, the difference between the hole effective mass of the second semiconductor nanocrystal and the hole effective mass of the first semiconductor nanocrystal may be less than or equal to about 1.5 $m_e$, less than or equal to about 1.0 $m_e$, less than or equal to about 0.7 $m_e$, less than or equal to about 0.5 $m_e$, or less than or equal to about 0.3 $m_e$. The second semiconductor nanocrystal may have an electron effective mass of less than 0.39 $m_e$, less than or equal to about 0.34 $m_e$, less than or equal to about 0.30 $m_e$, less than or equal to about 0.25 $m_e$, or less than or equal to about 0.20 $m_e$. The second semiconductor nanocrystal may have a hole effective mass of less than about 1.76 $m_e$, less than or equal to about 1.5 $m_e$, less than or equal to about 1.2 $m_e$, or less than or equal to about 0.9 $m_e$.

In such quantum dots, the bandgap energy of the second semiconductor nanocrystal may be larger than a bandgap energy of the first semiconductor nanocrystal. For example, the bandgap energy of the second semiconductor nanocrystal may be greater than about 1.0 times of the bandgap energy of the first semiconductor nanocrystal, and may be 3.0 times or less, 2.5 times or less, 2.0 times or less, or 1.5 times or less of the bandgap energy of the first semiconductor nanocrystal.

A lattice mismatch between the first semiconductor nanocrystal and the second semiconductor nanocrystal may be less than or equal to about 20%, or less than or equal to about 15%.

The amount of each component in the quantum dots described herein is determined by appropriate analysis means (e.g., inductively coupled plasma atomic emission spectroscopy (ICP-AES), X-ray photoelectron spectroscopy (XPS), ion chromatography, transmission electron microscopy energy-dispersive X-ray spectroscopy (TEM-EDS), etc.).

A mole ratio of the Group III element to the Group II element included in the quantum dot may be greater than about 0:1 and less than or equal to about 10:1. For example, the mole ratio of the Group III element to the Group II element may be less than or equal to about 5:1, less than or equal to about 4:1, less than or equal to about 3:1, less than or equal to about 2:1, less than or equal to about 1:1, less than or equal to about 0.8:1, less than or equal to about 0.6:1, less than or equal to about 0.5:1, less than or equal to about 0.4:1, or less than or equal to about 0.3:1. In addition, the mole ratio of the Group III element to the Group II element may be greater than about 0:1, greater than or equal to about 0.001:1, greater than or equal to about 0.01:1, greater than or equal to about 0.02:1, greater than or equal to about 0.03:1, greater than or equal to about 0.04:1, or greater than or equal to about 0.05:1.

A mole ratio of the Group III element included in the quantum dot to the Group II element of the core may be greater than about 0:1 and less than or equal to about 10:1. For example, the mole ratio of the Group III element to the Group II element of the core may be less than or equal to about 5:1, less than or equal to about 4:1, less than or equal to about 3:1, less than or equal to about 2:1, less than or equal to about 1:1, less than or equal to about 0.8:1, less than or equal to about 0.6:1, less than or equal to about 0.5:1, less than or equal to about 0.4:1, or less than or equal to about 0.3:1. Further, the mole ratio of the Group III element to the Group II element of the core may be greater than about 0:1, greater than or equal to about 0.001:1, greater than or equal to about 0.01:1, greater than or equal to about 0.02:1, greater than or equal to about 0.03:1, greater than or equal to about 0.04:1, or greater than or equal to about 0.05:1.

The mole ratio of the Group III element to the Group VI element included in the quantum dot may be greater than about 0:1 and less than or equal to about 10:1. For example, the mole ratio of the Group III element to the Group VI element may be less than or equal to about 5:1, less than or equal to about 4:1, less than or equal to about 3:1, less than or equal to about 2:1, less than or equal to about 1:1, less than or equal to about 0.8:1, less than or equal to about 0.6:1, less than or equal to about 0.5:1, less than or equal to about 0.4:1, or less than or equal to about 0.3:1. In addition, the mole ratio of the Group III element to the Group VI element may be greater than about 0:1, greater than or equal to about 0.001:1, greater than or equal to about 0.01:1, greater than or equal to about 0.02:1, greater than or equal to about 0.03:1, greater than or equal to about 0.04:1, or greater than or equal to about 0.05:1.

A mole ratio of the Group III element included in the quantum dot to the Group VI element of the core may be greater than about 0:1 and less than or equal to about 10:1. For example, the mole ratio of the Group III element to the Group VI element of the core may be less than or equal to about 5:1, less than or equal to about 4:1, less than or equal to about 3:1, less than or equal to about 2:1, less than or equal to about 1:1, less than or equal to about 0.8:1, less than or equal to about 0.6:1, less than or equal to about 0.5:1, less than or equal to about 0.4:1, or less than or equal to about 0.3:1. In addition, the mole ratio of the Group III element to the Group VI element of the core may be greater than about 0:1, greater than or equal to about 0.001:1, greater than or equal to about 0.01:1, greater than or equal to about 0.02:1, greater than or equal to about 0.03:1, greater than or equal to about 0.04:1, or greater than or equal to about 0.05:1.

The second semiconductor nanocrystal may include a gallium (Ga) or a gallium (Ga) chalcogenide compound.

The second semiconductor nanocrystal may include a compound represented by $M^1X^1$, wherein $M^1$ is In, Ga, or a combination thereof, and $X^1$ is S, Se, Te, or a combination thereof. The elemental ratio of $M^1$ and $X^1$ is not limited to 1:1 in inductively coupled plasma atomic emission spectroscopy (ICP-AES).

The second semiconductor nanocrystal may include a compound represented by Chemical Formula 1 or a combination thereof.

$$(M^2_{2-x}M^3_x)(X^2_{3-y}X^3_y) \quad \text{Chemical Formula 1}$$

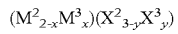

In Chemical Formula 1, $M^2$ and $M^3$ are each independently In, Ga, or a combination thereof, and $X^2$ and $X^3$ are each independently S, Se, Te, or a combination thereof, x is 0 to 2, and y is in the range of 0 to 3.

The quantum dot may further include a shell, e.g., one or more shells, including the third semiconductor nanocrystal. The third semiconductor nanocrystal may include a Group II-VI compound, a Group III-V compound, or a combination thereof. The third semiconductor nanocrystal may include ZnSe, ZnTeSe, ZnSeS, ZnTeS, ZnS, InP, InGaP, InAs, InGaAs, or a combination thereof. When the quantum dot includes two or more shells including the third semiconductor nanocrystal, the composition of the two or more shells including the third semiconductor nanocrystal may be the same or different from each other, and may be disposed continuously or discontinuously, e.g., may be continuous or discontinuous.

The shell including the third semiconductor nanocrystal may be disposed outside the shell including the second semiconductor nanocrystal, between the core and the shell including the second semiconductor nanocrystal, or at both thereof. When the shell including the third semiconductor nanocrystal is disposed between the core and the shell including the second semiconductor nanocrystal, a, e.g., at least one, shell including the Group II-VI compound (e.g., the shell including the zinc chalcogenide compound) may be present, for example, one shell including the Group II-VI compound may be present or two or more shells including the Group II-VI compound may be present, and two or more shells may be disposed continuously or discontinuously, e.g., may be continuous or discontinuous. In the case of two or more shells including the Group II-VI compound, the composition of the Group II-VI compound may be different or the same, respectively. For example, in two or more shells including the Group II-VI compound, the types, amounts, or all of the Group VI elements may be independently different from each other. In addition, in the two or more shells including the Group II-VI compound, a shell relatively close to, e.g., closest, the core may include Se, and a shell relatively far, e.g., farthest, from the core may include S.

The first semiconductor nanocrystal may include a zinc chalcogenide compound. For example, the first semiconductor nanocrystal may include zinc and may further include selenium, tellurium, sulfur, or a combination thereof. The first semiconductor nanocrystal may include all of zinc, selenium, and tellurium, and may be in a form in which selenium is alloyed (e.g., doped) in the zinc telluride crystal. The amount of tellurium in the first semiconductor nanocrystal may be in excess relative to the amount of selenium.

A mole ratio (Te:Se) of tellurium to selenium included in the quantum dot may be greater than about 0:1 and less than or equal to about 5:1. For example, the mole ratio (Te:Se) of tellurium to selenium may be greater than or equal to about 0.01:1, greater than or equal to about 0.05:1, greater than or equal to about 0.1:1, greater than or equal to about 0.2:1, greater than or equal to about 0.3:1, greater than or equal to about 0.4:1, greater than or equal to about 0.5:1, or greater than or equal to about 0.6:1. In addition, the mole ratio (Te:Se) of tellurium to selenium may be less than or equal to about 5:1, less than or equal to about 4:1, less than or equal to about 3:1, less than or equal to about 2:1, less than or equal to about 1.5:1, less than or equal to about 1:1, less than or equal to about 0.8:1, less than or equal to about 0.7:1, less than or equal to about 0.6:1, less than or equal to about 0.5:1, less than or equal to about 0.4:1, less than or equal to about 0.3:1, less than or equal to about 0.2:1, less than or equal to about 0.1:1, or less than or equal to about 0.05:1.

In the first semiconductor nanocrystal, the mole ratio (Te:Se) of tellurium to selenium may be greater than about 0:1 and less than or equal to about 10:1. For example, the mole ratio (Te:Se) of tellurium to selenium in the first semiconductor nanocrystal may be greater than or equal to about 0.01:1, greater than or equal to about 0.05:1, greater than or equal to about 0.1:1, greater than or equal to about 0.2:1, greater than or equal to about 0.3:1, greater than or equal to about 0.4:1, greater than or equal to about 0.5:1, greater than or equal to about 0.6:1, greater than or equal to about 0.7:1, or greater than or equal to about 0.8:1. In addition, the mole ratio (Te:Se) of tellurium to selenium in the first semiconductor nanocrystal may be less than or equal to about 10:1, less than or equal to about 7:1, less than or equal to about 5:1, less than or equal to about 4:1, less than or equal to about 3:1, less than or equal to about 2:1, less than or equal to about 1.5:1, or less than or equal to about 1:1. The first semiconductor nanocrystal may include $ZnTe_xSe_{1-x}$, wherein x greater than or equal to about 0.1, greater than or equal to about 0.2, greater than or equal to about 0.3, greater than or equal to about 0.4, or greater than or equal to about 0.5 and less than or equal to about 0.9, less than or equal to about 0.8, less than or equal to about 0.7, or less than or equal to about 0.6.

The mole ratio (Te:Zn) of tellurium to zinc included in the quantum dot may be greater than about 0:1 and less than or equal to about 10:1. For example, the mole ratio (Te:Zn) of tellurium to zinc may be greater than or equal to about 0.01:1, greater than or equal to about 0.05:1, greater than or equal to about 0.1:1, greater than or equal to about 0.2:1, greater than or equal to about 0.3:1, greater than or equal to about 0.4:1, greater than or equal to about 0.5:1, greater than or equal to about 0.6:1, greater than or equal to about 0.7:1, greater than or equal to about 0.8:1, or greater than or equal to about 0.9:1. In addition, the mole ratio (Te:Zn) of tellurium to zinc may be less than or equal to about 10:1, less than or equal to about 9:1, less than or equal to about 8:1, less than or equal to about 7:1, less than or equal to about 6:1, less than or equal to about 5:1, less than or equal to about 4:1, or less than or equal to about 3:1.

The quantum dots may further include sulfur. When sulfur is present, a mole ratio (S:Zn) of sulfur to zinc may be greater than or equal to about 0.05:1, greater than or equal to about 0.1:1, greater than or equal to about 0.15:1, greater than or equal to about 0.2:1, greater than or equal to about 0.25:1, greater than or equal to about 0.3:1, or greater than or equal to about 0.35:1 and less than or equal to about 0.95:1, less than or equal to about 0.9:1, less than or equal to about 0.85:1, less than or equal to about 0.8:1, less than or equal to about 0.75:1, less than or equal to about 0.7:1, less than or equal to about 0.65:1, less than or equal to about 0.6:1, less than or equal to about 0.5:1, less than or equal to about 0.4:1, or less than or equal to about 0.3:1.

In quantum dots, the thickness of each shell may be appropriately selected. The thickness of each shell may be independently about 1 monolayer (ML) or more (e.g., about 2 ML or more, about 3 ML or more, about 4 ML or more, or about 5 ML or more) and about 10 ML or less (e.g., about 9 ML or less, about 8 ML or less, about 7 ML or less, about 6 ML or less, or about 5 ML or less). The thickness of the shell may be determined taking into consideration the composition of the whole quantum dot.

A quantum dot according to an embodiment does not include cadmium, lead, mercury, or a combination thereof, and includes a semiconductor compound having an electron effective mass of less than or equal to about 0.34 $m_e$ in a mole ratio of greater than or equal to about 0.3:1 to less than or equal to about 1:1 relative to a total number of moles in the quantum dot. For example, the quantum dot may include a semiconductor compound having an electron effective mass of less than or equal to about 0.34 $m_e$ in a mole ratio of greater than or equal to about 0.35:1, greater than or equal to about 0.4:1, greater than or equal to about 0.5:1, greater than or equal to about 0.6:1, or greater than or equal to about 0.8:1 relative to a total number of moles in the quantum dot. For example, the semiconductor compound may have an electron effective mass of less than or equal to about 0.32 $m_e$, less than or equal to about 0.30 $m_e$, less than or equal to about 0.25 $m_e$, or less than or equal to about 0.2 $m_e$, and greater than or equal to about 0.08 $m_e$, greater than about 0.08 $m_e$, greater than or equal to about 0.1 $m_e$, or greater than or equal to about 0.15 $m_e$. The amount (mole ratio) of the semiconductor compound having an electron effective mass of less than or equal to about 0.34 $m_e$ may be adjusted according to the size, composition, or a combination thereof of the quantum dot.

The semiconductor compound having an electron effective mass of less than or equal to about 0.34 $m_e$ may include a Group II-VI compound, a Group III-V compound, a Group III-VI compound, or a combination thereof. The Group II-VI compounds may be ZnSe, ZnTe, ZnTeSe, or a combination thereof. The Group III-V compounds may be InP, InAs, InSb, or a combination thereof. The Group III-VI compound may include $Ga_2S_3$ or $Ga_2Se_3$. Further, the quantum dot may include both a Group II-VI compound and a Group III-VI compound (e.g., ZnTeSe and $Ga_2S_3$).

The semiconductor compound having an electron effective mass of less than or equal to about 0.34 $m_e$ may include a compound $M^4X^4$, wherein $M^4$ is Zn, Ga, or a combination thereof, and $X^4$ is S, Se, Te, or a combination thereof. The elemental ratio of $M^4$ and $X^4$ is not limited to 1:1 in inductively coupled plasma atomic emission spectroscopy (ICP-AES).

The semiconductor compound having an electron effective mass of less than or equal to about 0.34 $m_e$ may include ZnTe, ZnSe, InP, InAs, InSb, GaS, GaSe, or a combination thereof, and may be a binary element compound, a ternary element compound, or a quaternary element compound. Further, the semiconductor compound having an electron effective mass of less than or equal to about 0.34 $m_e$ may include zinc selenide, zinc telluride, gallium sulfide, or a combination thereof. The semiconductor compound having an electron effective mass of less than or equal to about 0.34 $m_e$ may not be a binary element compound of zinc sulfide.

The quantum dots may include a core including the first semiconductor nanocrystal and n shells (n is an integer greater than or equal to 1) disposed outside the core. In such a core-shell quantum dot, the amount (mole ratio) of the semiconductor compound having an electron effective mass of less than or equal to about 0.34 $m_e$ may be adjusted according to the composition of the core and the shell, the size of the core, the thickness of the shell, the number of shells, or a combination thereof. A shell, e.g., at least one of the n shells, may include the semiconductor compound having an electron effective mass of less than or equal to about 0.34 $m_e$, and when one shell is present, the shell may be formed of the semiconductor compound having an electron effective mass of less than or equal to about 0.34 $m_e$. When n is 2 or more, a shell, e.g., at least one of the shells, may include the semiconductor compound having an electron effective mass of less than or equal to about 0.34 $m_e$. When several shells are included, a number m of the n shells may include the semiconductor compound having an electron effective mass of less than or equal to about 0.34 $m_e$, wherein m is an integer greater than or equal to n/2. When the semiconductor compound having an electron effective mass of less than or equal to about 0.34 $m_e$ is included in a plurality of shells, the shells may have the same composition (type, amount, etc.) of the shells or may be different from each other, and the shells may be continuously or discontinuously disposed. In addition, the core may also include the semiconductor compound having an electron effective mass of less than or equal to about 0.34 $m_e$, and the type of the elements, amount of the elements, or both thereof may be different from or the same as the semiconductor compound included in the shell. In addition, the core-shell quantum dot may further include a shell including a binary element compound made of zinc sulfide as well as a shell including the semiconductor compound having an electron effective mass of less than or equal to about 0.34 $m_e$.

A quantum dot according to an embodiment does not include cadmium, lead, mercury, or a combination thereof, and includes a semiconductor compound having a hole effective mass of less than or equal to about 1.5 $m_e$ in a mole ratio of greater than or equal to about 0.3 and less than or equal to about 1:1 relative to a total number of moles in the quantum dot. Such quantum dots may include a semiconductor compound having a hole effective mass of less than or equal to about 1.5 $m_e$ in a mole ratio of greater than or equal to about 0.35:1, greater than or equal to about 0.4:1, greater than or equal to about 0.5:1, greater than or equal to about 0.6:1, or greater than or equal to about 0.8:1 relative to a total number of moles in the quantum dot. For example, the semiconductor compound may have a hole effective mass of less than or equal to about 1.2 $m_e$, less than or equal to about 1.0 $m_e$, less than or equal to about 0.9 $m_e$ and greater than or equal to about 0.3 $m_e$, greater than or equal to about 0.32 $m_e$, or greater than or equal to about 0.35 $m_e$. The amount (mole ratio) of the semiconductor compound having a hole effective mass of less than or equal to about 1.5 $m_e$ may be adjusted according to the size, composition, or a combination thereof of the quantum dot.

The semiconductor compound having a hole effective mass of less than or equal to about 1.5 $m_e$ may include a Group II-VI compound, a Group III-V compound, a Group III-VI compound, or a combination thereof. The Group II-VI compound may be ZnSe, ZnTe, ZnTeSe, or a combination thereof. The Group III-V compound may be InP, InAs, InSb, or a combination thereof. The Group III-VI compound may be $Ga_2S_3$ or $Ga_2Se_3$. Further, the quantum dot may include both a Group II-VI compound and a Group III-VI compound (e.g., ZnTeSe and $Ga_2S_3$).

The semiconductor compound having a hole effective mass of less than or equal to about 1.5 $m_e$ may include a compound $M^4X^4$, wherein $M^4$ is Zn, Ga, or a combination thereof, and $X^4$ is S, Se, Te, or a combination thereof. The elemental ratio of $M^4$ and $X^4$ is not limited to 1:1 in inductively coupled plasma atomic emission spectroscopy (ICP-AES).

The semiconductor compound having a hole effective mass of less than or equal to about 1.5 $m_e$ may include ZnTe, ZnSe, InP, InAs, InSb, GaS, GaSe, or a combination thereof, and may be a binary element compound, a ternary element compound, or a quaternary element compound. Further, the semiconductor compound having a hole effective mass of less than or equal to about 1.5 $m_e$ may include zinc selenide, zinc telluride, gallium sulfide, or a combination thereof. The semiconductor compound having a hole effective mass of less than or equal to about 1.5 $m_e$ may not be a binary element compound composed of zinc sulfide.

The quantum dot may include a core including the first semiconductor nanocrystal and n shells (n is an integer greater than or equal to 1) disposed outside the core. In such a core-shell quantum dot, the amount (mole ratio) of the semiconductor compound having a hole effective mass of less than or equal to about 1.5 $m_e$ may be adjusted according to the composition of the core and the shell, the size of the core, the thickness of the shell, the number of shells, or a combination thereof. A shell, e.g., at least one of the n shells, may include the semiconductor compound having a hole effective mass of less than or equal to about 1.5 $m_e$, and when one shell is present, the shell may be formed of the semiconductor compound having a hole effective mass of less than or equal to about 1.5 $m_e$. When n is 2 or more, a shell, e.g., at least one of the shells, may include the semiconductor compound having a hole effective mass of less than or equal to about 1.5 $m_e$. When several shells are included, a number m of the n shells may include the semiconductor compound having a hole effective mass of less than or equal to about 1.5 $m_e$, wherein m is an integer greater than or equal to n/2. When the semiconductor compound having a hole effective mass of less than or equal to about 1.5 $m_e$ is included in the plurality of shells, the composition of the shells (type, amount, etc.) of the shells may be the same or different from each other, and the shells may be arranged continuously or discontinuously. In addition, the core may also include the semiconductor compound having a hole effective mass of less than or equal to about 1.5 $m_e$, and the type of the elements, amount of the elements, or both thereof may be different from or the same as the semiconductor compound included in the shell. In addition, the core-shell quantum dot may further include a shell including a binary element compound of zinc sulfide as well as a shell including the semiconductor compound having a hole effective mass of less than or equal to about 1.5 $m_e$.

A maximum emission peak of the quantum dot may exist in a wavelength range of greater than or equal to about 400 nm and less than or equal to about 1,600 nm. For example, the maximum emission peak of the quantum dot may exist in a wavelength range of greater than or equal to about 420 nm, greater than or equal to about 430 nm, greater than or equal to about 440 nm, greater than or equal to about 500 nm, greater than or equal to about 520 nm, greater than or equal to about 530 nm, greater than or equal to about 600 nm, greater than or equal to about 610 nm, or greater than or equal to about 620 nm. In addition, the maximum emission peak of the quantum dot may be less than or equal to about 700 nm, for example, less than or equal to about 680 nm, less than or equal to about 660 nm, less than or equal to about 650 nm, less than or equal to about 640 nm, less than or equal to about 630 nm, less than or equal to about 580 nm, less than or equal to about 570 nm, for example, less than or equal to about 560 nm, less than or equal to about 550 nm, less than or equal to about 540 nm, less than or equal to about 535 nm, less than or equal to about 500 nm, for example, less than or equal to about 490 nm, less than or equal to about 480 nm, less than or equal to about 470 nm, less than or equal to about 460 nm, or less than or equal to about 450 nm.

The FWHM of the maximum emission peak of the quantum dot may be less than or equal to about 40 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, less than or equal to about 27 nm, or less than or equal to about 26 nm. The maximum emission peak of the quantum dot may exist in the range of greater than or equal to about 500 nm and less than or equal to about 550 nm, and the FWHM may be less than or equal to about 35 nm.

The (average) particle size of core-shell quantum dots (or quantum dot population) may be greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 7.5 nm, greater than or equal to about 8 nm, greater than or equal to about 8.5 nm, greater than or equal to about 9 nm, greater than or equal to about 9.5 nm, or greater than or equal to about 10 nm. In addition, the (average) particle size of the core-shell quantum dots (or quantum dot population) may be less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, or less than or equal to about 10 nm. Herein, the size of the quantum dot may be a diameter (or a diameter calculated by assuming a sphere from an electron microscope two-dimensional image of the quantum dot if the quantum dot is not a sphere). Herein, the size may be the size of a single quantum dot or an average size of a quantum dot population. The size of the quantum dot may be obtained, for example, using an image analysis program (e.g., imageJ) on a transmission electron microscope image.

In the core-shell quantum dot, the size (e.g., average size) of the core(s) may be greater than or equal to about 2 nm, greater than or equal to about 2.5 nm, greater than or equal to about 3 nm, greater than or equal to about 3.5 nm, greater than or equal to about 4 nm, or greater than or equal to about 4.5 nm. In addition, the size of the core (e.g., average size) may be less than or equal to about 7 nm, less than or equal to about 6 nm, less than or equal to about 5 nm, less than or equal to about 4 nm, less than or equal to about 3 nm, or less than or equal to about 2 nm.

The aforementioned quantum dot population may have a standard deviation of the size of less than about 18%, for example, less than or equal to about 17%, less than or equal to about 16%, less than or equal to about 15%, less than or equal to about 14%, less than or equal to about 13%, less than or equal to about 12%, or less than or equal to about 11% of the average size. Also, the quantum dot population may have a standard deviation of the size of greater than or equal to about 8%, greater than or equal to about 9%, or greater than or equal to about 10% of the average size.

The quantum efficiency of such a quantum dot may be greater than or equal to about 40%, greater than or equal to about 50%, greater than or equal to about 55%, greater than or equal to about 60%, greater than or equal to about 65%, greater than or equal to about 70%, greater than or equal to about 80%, greater than or equal to about 85%, greater than or equal to about 90%, or greater than or equal to about 95%.

The quantum dots may include organic ligands on the surface. The organic ligand may include $RCOOH$, $RNH_2$, $R_2NH$, $R_3N$, $RSH$, $RH_2PO$, $R_2HPO$, $R_3PO$, $RH_2P$, $R_2HP$, $R_3P$, $ROH$, $RCOOR'$, $RPO(OH)_2$, $RHPOOH$, $R_2POOH$, wherein, R and R' may independently include a C1 to C40 (e.g., a C3 to C30 or C6 to C24) substituted or unsubstituted aliphatic hydrocarbon group, a C6 to C40 substituted or unsubstituted aromatic hydrocarbon group, or a combination thereof), or a combination thereof. Two or more different ligands may be used.

Specific examples of the organic ligand compound may be methane thiol, ethane thiol, propane thiol, butane thiol, pentane thiol, hexane thiol, octane thiol, dodecane thiol, hexadecane thiol, octadecane thiol, benzyl thiol, methane amine, ethane amine, propane amine, butane amine, pentane amine, hexane amine, octane amine, dodecane amine, hexadecyl amine, oleyl amine, octadecyl amine, dimethyl amine, diethyl amine, dipropyl amine, methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, stearic acid, a phosphine such as methyl phosphine, ethyl phosphine, propyl phosphine, butyl phosphine, pentyl phosphine, tributylphosphine, trioctylphosphine, and the like, a phosphine oxide compound such as methyl phosphine oxide, ethyl phosphine oxide, propyl phosphine oxide, butyl phosphine oxide, trioctylphosphine oxide, and the like, diphenyl phosphine, triphenyl phosphine compound or an oxide compound thereof, phosphonic acid, and the like, but are not limited thereto. Two or more different organic ligand compounds may be used. The organic ligand compound may be a combination of $RCOOH$ and an amine (e.g., $RNH_2$, $R_2NH$ $R_3N$, or a combination thereof).

In an embodiment, the organic ligand may not include a compound having both a carboxylic acid group and a thiol group (e.g., glutathione). Such quantum dot may be water insoluble.

The aforementioned quantum dots may be easily synthesized using various preparation methods, for example, a method of preparing quantum dots including a core and a shell. For example, the method of preparing quantum dots may include preparing a core including a first semiconductor nanocrystal including a Group II-VI semiconductor compound that does not include cadmium, lead, mercury, or a combination thereof, and reacting the precursors forming the second semiconductor nanocrystal together with the core in in an appropriate solvent. In this step, a second semiconductor nanocrystal shell including a Group III-VI semiconductor compound may be formed outside the core.

Optionally, forming a shell, e.g., one or more shells, including the third semiconductor nanocrystals may be further performed before, after, or both of forming the shell including the second semiconductor nanocrystals. For example, before forming the shell including the second semiconductor nanocrystal, the reacting of the precursors forming the third semiconductor nanocrystal together with the core may be included. Further, after forming the shell including the second semiconductor nanocrystal, forming a shell, i.e., one or more shells, including the third semiconductor nanocrystal may be performed. In addition, after forming at least one shell including the third semiconductor nanocrystal outside the core by reacting the precursors for forming the third semiconductor nanocrystal together with the core, forming a shell, i.e., one or more shells, including the second semiconductor nanocrystals thereon and forming a shell, e.g., one or more shells, including the third semiconductor nanocrystals may be performed sequentially.

Herein, the core of the first semiconductor nanocrystal including the Group II-VI semiconductor compound is prepared by reacting a precursor of a Group II compound and a precursor of a Group VI compound to synthesize a Group II-VI semiconductor nanocrystal, or a commercially available Group II-VI semiconductor nanocrystal core. The Group II-VI semiconductor nanocrystal core may be a core including a first semiconductor nanocrystal including zinc chalcogenide (e.g., a compound including zinc, selenium, and tellurium). Such a core may be prepared by injecting and reacting a zinc precursor, a selenium precursor, and a tellurium precursor in an organic solvent heated to a reaction temperature in the presence of an organic ligand, a surfactant, or a combination thereof. Such a core is formed, for example, by a hot injection method in which a solution including a zinc precursor and optionally a ligand is heated to a high temperature (e.g., 200° C. or higher), and a selenium precursor and a tellurium precursor are injected together.

When the aforementioned reaction is completed, the reaction is terminated by lowering the temperature, and an excess non-solvent is added to precipitate the nanocrystal core, and the core including the first semiconductor nanocrystal may be obtained by washing and filtering the core.

Thereafter, in a method of forming a shell on the surface of the obtained semiconductor nanocrystal core, while heating a solvent including the obtained core, precursors of semiconductor nanocrystals for forming a shell may be injected thereinto to perform a reaction. A solvent and a metal precursor (e.g., a Group III precursor) forming a shell are first injected into a separate reactor and heated, and non-metal precursors (Group VI precursors) forming the core and shell of the obtained semiconductor nanocrystal is added thereto. Subsequently, the method of forming the layers constituting the additional shell is similar to that described above.

The metal and non-metal precursors may be appropriately selected depending on the compositions of the core and the shell. The metal precursors may include a metal powder, an alkylated metal, a metal carboxylate, a metal hydroxide, a metal halide, a metal oxide, a metal inorganic salt (e.g., nitrate), a metal sulfate, a metal acetylacetonate, or a combination thereof, but is not limited thereto. Examples of the non-metal precursor may be compounds including non-metal elements used in the synthesis of quantum dots.

When the metal element is zinc, the zinc precursors may include Zn metal powder, alkylated Zn compound, Zn alkoxide, Zn carboxylate, Zn nitrate, Zn percholate, Zn sulfate, Zn acetylacetonate, Zn halide, Zn cyanide, Zn hydroxide, Zn oxide, Zn peroxide, or a combination thereof. For example, examples of zinc precursors may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, and the like, and two or more different zinc precursors may be used.

When the metal element is gallium, examples of gallium precursors may include gallium carboxylate such as trimethyl gallium, gallium acetate, gallium palmitate, and gallium stearate, gallium hydroxide, gallium chloride, gallium oxide, gallium nitrate, gallium sulfate, or a combination thereof.

When the metal element is indium, examples of indium precursors may include trimethyl indium, indium carboxylate such as indium acetate, indium palmitate, and indium stearate, indium hydroxide, indium chloride, indium oxide, indium nitrate, indium sulfate, or a combination thereof.

When the non-metal element is a Group VI element, the Group VI element precursor may be an alkylphosphine including a chalcogen element.

When the Group VI element is selenium, examples of the selenium precursors may include selenium, selenium-trioctylphosphine (Se-TOP), selenium-tributylphosphine (Se-TBP), and selenium-triphenylphosphine (Se-TPP), selenium-tributylphosphine (Se-TBP), selenium-diphenylphosphine (Se-DPP), or a combination thereof, but are not limited thereto.

When the Group VI element is sulfur, examples of the sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bistrimethylsilyl sulfur, ammonium sulfide, sodium sulfide, or a combination thereof, but are not limited thereto.

When the Group VI element is tellurium, examples of the tellurium precursor may include tellurium-tributylphosphine (Te-TBP), tellurium-triphenylphosphine (Te-TPP), tellurium-diphenylphosphine (Te-DPP), or a combination thereof, but are not limited thereto.

When the non-metal element is phosphorus (P), examples of phosphorus precursors may include tris(trimethylsilyl) phosphine), tris(dimethylamino)phosphine, triethylphosphine, tributylphosphine, trioctylphosphine, triphenyl phosphine, tricyclohexylphosphine, or a combination thereof, but are not limited thereto.

The solvent may be a C6 to C22 primary alkylamine such as hexadecylamine; a C6 to C22 secondary alkylamine such as dioctylamine; a C6 to C40 tertiary alkylamine such as trioctylamine; a nitrogen-containing heterocyclic compound such as pyridine; a C6 to C40 aliphatic hydrocarbon (e.g., alkane, alkene, alkyne, and the like) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, benzyl ether, or a combination thereof, but is not limited thereto. The type and amount of the solvent may be appropriately selected taking into consideration the types of precursors and organic ligands to be used.

In the aforementioned forming reaction, a precursor of a semiconductor nanocrystal, an organic ligand for forming the core and the shell of the semiconductor nanocrystal, or a combination thereof are appropriately added, injected, or a combination thereof into a solvent at each step to prepare a mixture, and the mixture may be, optionally, heated to a predetermined temperature under vacuum, an inert atmosphere, or a combination thereof.

The first reaction temperature for forming the core may be greater than or equal to about 250° C., greater than or equal to about 260° C., greater than or equal to about 270° C., greater than or equal to about 280° C., greater than or equal to about 290° C., or greater than or equal to about 300° C. In addition, the first reaction temperature may be less than or equal to about 350° C., less than or equal to about 340° C., less than or equal to about 330° C., less than or equal to about 320° C., or less than or equal to about 310° C. The reaction time for forming the core is not particularly limited and may be appropriately selected.

The reaction temperature for forming the shell may be appropriately adjusted within the range of greater than or equal to about 200° C., greater than or equal to about 210° C., greater than or equal to about 220° C., greater than or equal to about 230° C., greater than or equal to about 240° C., greater than or equal to about 250° C., greater than or equal to about 260° C., greater than or equal to about 270° C., greater than or equal to about 280° C., greater than or equal to about 290° C., or greater than or equal to about 300° C. and less than or equal to about 340° C., less than or equal to about 325° C., or less than or equal to about 310° C. The reaction time for forming the shell may be appropriately selected taking into consideration the desired shell composition.

Optionally, the mixture may be heated to the aforementioned predetermined temperature and then cooled again before addition of further reactants. For example, after the shell including the second semiconductor nanocrystal is prepared, the mixture may be cooled again before addition of precursors for preparing the shell including the third semiconductor nanocrystal thereto. The cooling temperature may be less than or equal to about 150° C., less than or equal to about 130° C., or less than or equal to about 100° C. The cooling may be performed to prevent a rapid reaction of such further reactants at elevated temperatures. For example, cooling may be performed to prevent non-uniform formation of the shell including the third semiconductor nanocrystal on the shell including the second semiconductor nanocrystal.

The amount and concentration of each precursor in the core formation reaction system and the reaction system for shell formation may be selected taking into consideration a desired core and shell composition and reactivity between the precursors. For example, taking into consideration the desired composition (Zn, Te, Se, Ga, or S) of the final quantum dot, a ratio between each precursor may be adjusted. The composition of the final quantum dot may be confirmed by appropriate analysis means such as inductively coupled plasma atomic emission analysis.

After the core formation process, shell formation process, or a combination thereof, when a non-solvent may be added to the reaction product, nanocrystalline particles (e.g., quantum dots or cores) coordinated with, e.g., bound to, the ligand compound may be separated. The non-solvent may be a polar solvent that is miscible with the solvent used in the core formation reaction, shell formation reaction, or a combination thereof, but may not be capable of dispersing the prepared nanocrystals. The non-solvent may be determined depending on the solvent used in the reaction, for example, acetone, ethanol, butanol, isopropanol, ethanol, water, tetrahydrofuran (THF), dimethyl sulfoxide (DMSO), diethylether, formaldehyde, acetaldehyde, ethylene glycol, and a solvent having a solubility parameter similar to those of the foregoing solvents, or a combination thereof. The separation may be performed by centrifugation, precipitation, chromatography, or distillation. Separated nanocrystals may be washed by adding to a washing solvent as desired. The washing solvent is not particularly limited, and a solvent having a solubility parameter similar to that of the ligand may be used. Examples include hexane, heptane, octane, chloroform, toluene, and benzene.

The quantum dots may be non-dispersible or non-soluble in water, the aforementioned non-solvent, or a combination thereof.

The quantum dots may be dispersed in the aforementioned organic solvent. For example, the quantum dots may be dispersed by a C6 to C40 aliphatic hydrocarbon, a C6 to C40 substituted or unsubstituted aromatic hydrocarbon, or a combination thereof.

The aforementioned quantum dots may be included in the quantum dot composition. The quantum dot composition may include an organic solvent, a liquid vehicle, or a combination thereof, and may further include, optionally, a polymerizable monomer including a carbon-carbon double bond, and a (photo) initiator. The amount of quantum dots in the composition may be appropriately adjusted taking into consideration the final use and composition of the composition. The amount of quantum dots may be greater than or equal to about 0.1 wt %, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a solid of the composition. In addition, the amount of quantum dots may be less than or equal to about 70 wt %, less than or equal to about 65 wt %, less than or equal to about 60 wt %, less than or equal to about 55 wt %, or less than or equal to about 50 wt % based on a solid of the composition.

The quantum dot composition may be a photosensitive composition capable of forming a pattern using a photolithography process or an inkjet composition capable of forming a pattern using an inkjet process.

The quantum dot composition may further include a compound including a carboxylic acid group. Such a compound may include, for example, a monomer compound including a carboxylic acid group and a carbon-carbon double bond, a monomer compound including a multiple aromatic ring and a carboxylic acid group (—COOH), or a combination thereof.

For specific descriptions on the quantum dot composition (e.g., photosensitive composition), US-2017-0059988-A1 may be referred, the content of which in its entirety is herein incorporated herein by reference.

The quantum dot polymer composite may be configured in a form in which the aforementioned quantum dots are dispersed in a polymer matrix.

The amount of the quantum dots in the polymer matrix may be appropriately selected and is not particularly limited. For example, the amount of the quantum dots in the polymer matrix may be greater than or equal to about 0.1 wt % and less than or equal to about 70 wt % based on a total weight of the composite, but is not limited thereto. For example, the amount of quantum dots in the polymer matrix may be greater than or equal to about 0.3 wt %, greater than or equal to about 0.2 wt %, or greater than or equal to about 1.0 wt % and less than or equal to about 65 wt %, less than or equal to about 60 wt %, less than or equal to about 55 wt %, or less than or equal to about 50 wt % based on a total weight of the composite.

The polymer matrix may include a thiolene polymer, a (meth)acrylate polymer, a urethane-based resin, an epoxy-based resin, a vinyl-based polymer, a silicone resin, or a combination thereof. The thiolene polymer is disclosed in detail in US-2015-0218444-A1, the content of which in its entirety is here incorporated by reference. The (meth)acrylate-based polymer, urethane-based resin, epoxy-based, vinyl-based polymer, and silicone resin may be synthesized or commercially available.

The quantum dot polymer composite may further include metal oxide particulates. The metal oxide particulates may include, for example, $SiO_2$, $ZnO_2$, $TiO_2$, $ZrO_2$, or a combination thereof.

The quantum dot polymer composite may be in the form of a sheet.

The quantum dot polymer composite may be in the form of a quantum dot laminate structure disposed on a substrate. The quantum dot laminate structure may have a quantum dot polymer composite pattern including a repeating section, e.g., at least one repeating sections, that emit light of a predetermined wavelength. The quantum dot polymer composite pattern may include a, e.g., at least one, repeating section, such as a first section that emits first light, a second section that emits second light, or a combination thereof. The first section and the second section may each independently include quantum dots that emit light of different wavelengths.

In this method of manufacturing a quantum dot laminate structure, a film of a quantum dot composition is formed on a substrate, a selected region of the film is exposed to light having a predetermined wavelength (for example, a wavelength of less than or equal to about 400 nm), and the exposed film is developed by an alkali developer to obtain a pattern of the quantum dot polymer composite.

The quantum dot composition is as described above. The aforementioned quantum dot composition may be applied to a predetermined thickness by using a suitable method such as spin coating or slit coating on a substrate to form a film, and the formed film may be subjected to pre-baking (PRB) as desired. Conditions such as temperature, time, and atmosphere of the pre-baking may be appropriately selected.

The formed (or optionally pre-baked) film may be exposed to light having a predetermined wavelength (for example, a wavelength of less than or equal to about 400 nm) under a mask having a predetermined pattern, and the wavelength and intensity of the light may be selected taking into consideration the type and amount of the photoinitiator, the type and amount of quantum dots, and the like.

When the exposed film is treated with an alkali developer (e.g., dipped or sprayed), the portion of the film not irradiated with light is dissolved and a desired pattern is obtained. The obtained pattern may be post-baked (POB) for a predetermined time (e.g., greater than or equal to about 10 minutes, or greater than or equal to about 20 minutes) at a temperature of about 150° C. to about 230° C., for example, in order to improve the crack resistance and solvent resistance of the pattern, if desired.

When the pattern of the quantum dot polymer composite has a plurality of repeating sections, a plurality of composition including quantum dots (e.g., red light-emitting quantum dots, green light-emitting quantum dots, or optionally blue light-emitting quantum dots) having desired emission properties (photoluminescence peak wavelength, etc.) for forming each repeating section may be prepared, and then the aforementioned pattern formation process for each composition may be repeated a desired number of times (e.g., 2 or more times, or 3 or more times) to obtain a quantum dot polymer composite having a desired pattern.

An ink composition including the aforementioned quantum dots and a liquid vehicle may be used for pattern formation. For example, an ink composition including quantum dots, a liquid vehicle, and a monomer is deposited on a desired area of the substrate, polymerization is performed after optionally removing the liquid vehicle, or the liquid vehicle is removed to form a pattern. The quantum dot polymer composite pattern may be a pattern in which two or more different color-emitting sections (e.g., RGB color sections) are repeated, and the quantum dot polymer composite pattern may be used as a photoluminescent color filter in a display device.

The aforementioned quantum dots may be included in an electronic device. Such an electronic device may include a display device, a light emitting diode (LED), an organic light emitting diode (OLED), a quantum dot LED, a sensor, a solar cell, an imaging sensor, a photodetector, or a liquid crystal display device, but is not limited thereto.

The aforementioned quantum dots may be included in an electronic apparatus. Such an electronic apparatus may include, but are not limited to, a portable terminal device, a monitor, a notebook personal computer (PC), a television, an electric signboard, a camera, and an automobile. The electronic apparatus may be a portable terminal device, a monitor, a notebook PC, or a television including a display device including quantum dots. The electronic apparatus may be a camera or a portable terminal device including an image sensor including quantum dots. The electronic apparatus may be a camera or a car including a photodetector including quantum dots.

Referring to FIG. 1, the electronic device 1000 includes a first electrode 11 and a second electrode 15 facing each other, and an active layer 13 disposed between the first electrode 11 and the second electrode 15 and including the aforementioned quantum dots.

According to an embodiment, an electronic device including quantum dots may be an electroluminescent device. For example, in the quantum dots of the active layer 13, electrons and holes injected from the first electrode 11 and the second electrode 15 are recombined to form an exciton, and the active layer 13 may be a light emitting layer capable of emitting light of a certain wavelength by the energy of the formed excitons. In addition, an electronic device including a quantum dot may be a photo detector or a solar cell. For example, the active layer 13 including the quantum dots may be a light absorption layer that absorbs external photons and separates them into electrons and holes to provide electrons and holes to the first electrode 11 and the second electrode 15.

The hole auxiliary layer 12 may be disposed between the first electrode 11 and the active layer 13, and the electron auxiliary layer 14 may be disposed between the second electrode 15 and the active layer 13.

The electronic device 1000 may further include a substrate (not shown). The substrate may be disposed on the first electrode 11 side or on the second electrode 15 side. The substrate may be a substrate including an insulating material (e.g., an insulating transparent substrate). In addition, the substrate may include glass, various polymers such as a polyester (e.g., polyethyleneterephthalate (PET), polyethylenenaphthalate (PEN)), a polycarbonate, a polyacrylate, a polyimide, a polyamideimide, and the like, inorganic materials such as a polysiloxane (e.g., polydimethylsiloxane (PDMS)), $Al_2O_3$, ZnO, and the like, or a combination thereof, and may be made of a silicon wafer. Herein, "transparent" refers to may mean that transmittance through which light of a certain wavelength (e.g., light emitted from the quantum dots) passes is greater than or equal to about 85%, greater than or equal to about 88%, greater than or equal to about 90%, greater than or equal to about 95%, greater than or equal to about 97%, or greater than or equal to about 99%. A thickness of the substrate may be appropriately selected considering a substrate material, and the like, but is not particularly limited. The transparent substrate may have flexibility.

One of the first electrode 11 and the second electrode 15 may be an anode and the other may be a cathode. For example, the first electrode 11 may be an anode and the second electrode 15 may be a cathode.

The first electrode 11 may be made of a conductor, for example, a metal, a conductive metal oxide, or a combination thereof. The first electrode 11 may be, for example, made of a metal such as nickel, platinum, vanadium, chromium, copper, zinc, and gold or an alloy thereof, a conductive metal oxide such as zinc oxide, indium oxide, tin oxide, indium tin oxide (ITO), indium zinc oxide (IZO), or fluorine doped tin oxide, or, or a combination of a metal and an oxide such as ZnO and Al or $SnO_2$ and Sb, but is not limited thereto. The second electrode 15 may be made of a conductor, for example a metal, a conductive metal oxide, a conductive polymer, or a combination thereof. The second electrode 15 may be for example made of a metal such as aluminum, magnesium, calcium, sodium, potassium, titanium, indium, yttrium, lithium, gadolinium silver, gold, platinum, tin, lead, cesium, and barium or an alloy thereof, a multi-layered structure material such as LiF/Al, lithium oxide ($Li_2O$)/Al, 8-hydroxyquinolinato lithium (Liq)/Al, LiF/Ca, and $BaF_2$/Ca, but is not limited thereto. The conductive metal oxide is the same as described above.

The work functions of the first electrode 11 and the second electrode 15 are not particularly limited and may be appropriately selected. The work function of the first electrode 11 may be higher or lower, e.g., greater or less, than the work function of the second electrode 15.

The first electrode 11, the second electrode 15, or each of the first electrode 11 and the second electrode 15 may be a light-transmitting electrode, and the light-transmitting electrode is, for example, zinc oxide, indium oxide, tin oxide, indium tin oxide (ITO), indium zinc oxide (IZO), or a conductive metal oxide such as fluorine-doped tin oxide, or a thin single or multi-layer metal thin film. When any one of the first electrode 11 and the second electrode 15 is an opaque electrode, it may be made of an opaque conductor such as aluminum (Al), silver (Ag), or gold (Au).

The thicknesses of the first electrode 11, the second electrode 15, or each of the first electrode 11 and the second electrode 15 are not particularly limited, and may be appropriately selected taking into consideration device efficiency. For example, the thickness of the electrodes may be greater than or equal to about 5 nm, for example, greater than or equal to about 50 nm and less than or equal to about 100 micrometers (μm), for example, less than or equal to about 10 μm, less than or equal to about 1 μm, less than or equal to about 900 nm, less than or equal to about 500 nm, or less than or equal to about 100 nm.

The active layer 13 includes the quantum dots described above. The active layer 13 may include quantum dot layers of a monolayer or a plurality of monolayers. The plurality of monolayers may be 2 ML or more, 3 ML or more, or 4 ML or more, and may be 20 ML or less, 10 ML or less, 9 ML or less, 8 ML or less, 7 ML or less, or 6 ML or less. The active layer 13 may have a thickness of greater than or equal to about 5 nm, for example, greater than or equal to about 10 nm, greater than or equal to about 20 nm, or greater than or equal to about 30 nm, and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The active layer 13 may have a thickness of about 10 nm to about 150 nm, about 10 nm to about 100 nm, or about 10 nm to about 50 nm.

The electronic device 1000 may further include a hole auxiliary layer 12. The hole auxiliary layer 12 may be disposed between the first electrode 11 and the active layer 13. The hole auxiliary layer 12 may include a hole injection layer, a hole transport layer, an electron blocking layer, or a combination thereof. The hole auxiliary layer 12 may be a single component layer or a multilayer structure in which adjacent layers include different components.

The highest occupied molecular orbital (HOMO) energy level of the hole auxiliary layer 12 may have a HOMO energy level that may be matched with the HOMO energy level of the active layer 13 in order to enhance mobility of holes transferred from the hole auxiliary layer 12 to the active layer 13. As an example, the hole auxiliary layer 12 may include a hole injection layer disposed close to the first electrode 11 and a hole transport layer disposed close to the active layer 13.

The material included in the hole auxiliary layer 12 (e.g., a hole transport layer or a hole injection layer) is not particularly limited, and may include, for example, poly(9,9-dioctyl-fluorene-co-N-(4-butylphenyl)-diphenylamine) (TFB), polyarylamine, poly(N-vinylcarbazole), poly (3,4-ethylenedioxythiophene (PEDOT), poly(3,4-ethylenedioxythiophene)polystyrene sulfonate (PEDOT:PSS), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA (4,4',4"-Tris[phenyl(m-tolyl)amino]triphenylamine), 4,4',4"-tris(N-carbazolyl)-triphenylamine (TCTA), 1,1-bis[(di-4-tolylamino) phenylcyclohexane (TAPC), a p-type metal oxide (e.g., NiO, $WO_3$, $MoO_3$, etc.), a carbon-based material such as graphene oxide, or a combination thereof, but is not limited thereto.

When the electron blocking layer is included, the electron blocking layer may include poly(3,4-ethylenedioxythiophene):poly(styrenesulfonate) (PEDOT:PSS), poly(9,9-dioctyl-fluorene-co-N-(4-butylphenyl)-diphenylamine) (TFB) polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

In the hole auxiliary layer(s), the thickness of each layer may be appropriately selected. For example, the thickness of each layer may be greater than or equal to about 5 nm, greater than or equal to about 10 nm, greater than or equal to about 15 nm, or greater than or equal to about 20 nm and less than or equal to about 50 nm, for example, less than or equal to about 40 nm, less than or equal to about 35 nm, or less than or equal to about 30 nm, but is not limited thereto.

The electron auxiliary layer 14 may be disposed between the active layer 13 and the second electrode 15. The electron auxiliary layer 14 may include, for example, an electron injection layer that facilitates electron injection, an electron transport layer that facilitates electron transport, and a hole blocking layer that blocks the movement of holes, or a combination thereof. For example, an electron injection layer may be disposed between the electron transport layer and the cathode 15. For example, the hole blocking layer may be disposed between the active layer and the electron transport (injection) layer, but is not limited thereto. The thickness of each layer may be appropriately selected, for example, the thickness of each layer may be greater than or equal to about 1 nm and less than or equal to about 500 nm, but is not limited thereto. The electron injection layer may be an organic layer formed by vapor deposition, and the electron transport layer may include inorganic oxide nanoparticles.

The electron transport layer may include, for example, 1,4,5,8-naphthalene-tetracarboxylic dianhydride (NTCDA), bathocuproine (BCP), tris[3-(3-pyridyl)-mesityl]borane (3TPYMB), LiF, tris(8-hydroxyquinolinato)aluminum ($Alq_3$), tris(8-hydroxyquinolinato)gallium ($Gaq_3$), tris(8-hydroxyquinolinato)indium ($Inq_3$), bis(8-hydroxyquinoline) zinc ($Znq_2$), bis(2-(2-hydroxyphenyl)benzothiazolate)zinc ($Zn(BTZ)_2$), bis(10-hydroxybenzo[h]quinolinato)beryllium ($BeBq_2$), 8-(4-(4,6-di(naphthalen-2-yl)-1,3,5-triazin-2-yl) phenyl)quinolone (ET204), 8-hydroxyquinolinato lithium (Liq), an n-type metal oxide (e.g., ZnO, $HfO_2$, etc.), or a combination thereof, but is not limited thereto.

In addition, the electron transport layer may include a plurality of nanoparticles. The nanoparticles may include metal oxides including zinc, for example, zinc oxide, zinc magnesium oxide, or a combination thereof. The metal oxide may include $Zn_{1-x}M_xO$, wherein, M is Mg, Ca, Zr, W, Li, Ti, Y, Al, or a combination thereof and $0 \le x \le 0.5$. In the chemical formula, x may be greater than or equal to about 0.01 and less than or equal to about 0.3, for example, less than or equal to about 0.25, less than or equal to about 0.2, or less than or equal to about 0.15. An absolute value of a lowest unoccupied molecular orbital (LUMO) of the aforementioned quantum dots included in the active layer may be smaller than an absolute value of the LUMO of the metal oxide. An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm.

The hole blocking layer (HBL) may include, for example, 1,4,5,8-naphthalene-tetracarboxylic dianhydride (NTCDA), bathocuproine (BCP), tris[3-(3-pyridyl)-mesityl]borane (3TPYMB), LiF, Alq$_3$, Gaq$_3$, Inq$_3$, Znq$_2$, Zn(BTZ)$_2$, BeBq$_2$, or a combination thereof, but is not limited thereto.

Each thickness of the electron auxiliary layer 14 (e.g., electron injection layer, electron transport layer, or hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm, and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

Figure 2:
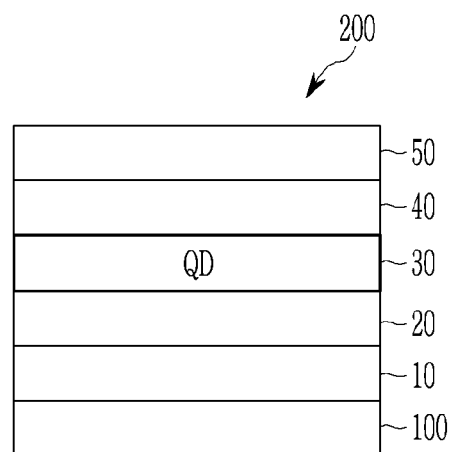
FIG. 2 is a schematic cross-sectional view of an electronic device (e.g., an electroluminescent device) according to an embodiment.

Referring to FIG. 2, an electroluminescent device according to an embodiment may have a structure in which the electroluminescent device 200 includes an anode 10 disposed on the transparent substrate 100 and a cathode 50 facing the anode 10. The anode 10 may include a metal oxide-based transparent electrode, and the cathode 50 facing the anode 10 may include a conductive metal having a low work function. For example, the anode may include an indium tin oxide (ITO, work function of about 4.6 eV to about 5.1 eV) electrode, and the cathode 50 may include an electrode including magnesium (Mg, work function of about 3.66 eV), aluminum (Al, work function of about 4.28 eV), or a combination thereof. Also, a hole auxiliary layer 20 may be disposed between the anode 10 and the quantum dot (QD) active layer 30. The hole auxiliary layer 20 may include a hole injection layer, a hole transport layer, or a hole injection layer and a hole transport layer. The hole injection layer may be disposed close to the anode 10 and the hole transport layer may be disposed close to the quantum dot active layer. Also, the electron auxiliary layer 40 may be disposed between the quantum dot active layer 30 and the cathode 50. The electron auxiliary layer 40 may include an electron injection layer, an electron transport layer, or an electron injection layer and an electron transport layer. The electron injection layer may be disposed close to the cathode 50 and the electron transport layer may be disposed close to the quantum dot active layer 30.

Figure 3:
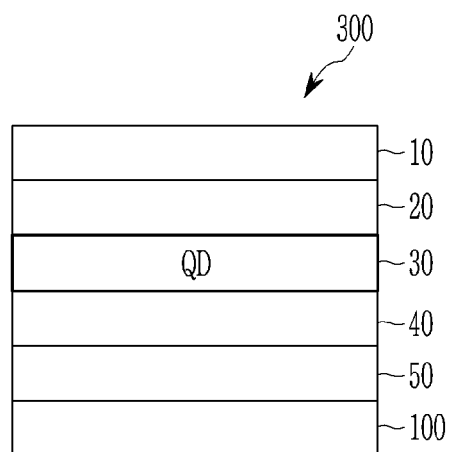
FIG. 3 is a schematic cross-sectional view of an electronic device (e.g., an electroluminescent device) according to an embodiment.

Referring to FIG. 3, an electroluminescent device according to an embodiment may have an inverted structure. The electroluminescent device 300 having an inverted structure may include a cathode 50 disposed on the transparent substrate 100 and an anode 10 facing the cathode 50. The cathode 50 may include a metal oxide-based transparent electrode, and the anode 10 facing the cathode 50 may include a conductive metal having a high work function. For example, the anode 50 may be an indium tin oxide (ITO, work function of about 4.6 eV to about 5.1 eV) electrode, the cathode 10 may be an electrode including gold (Au, work function of about 5.1 eV), silver (Ag, work function of about 4.26 eV), aluminum (Al, work function of 4.28 eV), or a combination thereof. Also, the electronic auxiliary layer 40 may be disposed between the quantum dot active layer 30 and the cathode 50. The electron auxiliary layer 40 may include an electron injection layer, an electron transport layer, or an electron injection layer and an electron transport layer. The electron injection layer may be disposed close to the cathode 50 and the electron transport layer may be disposed close to the quantum dot active layer 30. The electron auxiliary layer 40 may include, for example, a metal oxide in the electron transport layer, and a crystalline Zn oxide or an n-type doped metal oxide. Also, a hole auxiliary layer 20 may be disposed between the anode 10 and the quantum dot active layer 30. The hole auxiliary layer 20 may include a hole injection layer, a hole transport layer, or a hole injection layer and a hole transport layer. The hole injection layer may be disposed close to the anode 10, and the hole transport layer may be disposed close to the quantum dot active layer 30. The hole transport layer may include TFB, PVK, or a combination thereof, and the hole injection layer may include MoO$_3$ or other p-type metal oxides.

In the electroluminescent device, light of a certain wavelength generated in the active layer 30 is emitted to the outside through the light-transmitting electrode and the transparent substrate. For example, referring to FIG. 2, when a metal oxide-based transparent electrode (e.g., indium tin oxide (ITO)), which is a light-transmitting electrode, is applied to, e.g., disposed on, the anode 10, the light formed in the active layer emitted to the outside through the anode 10 and the transparent substrate 100. Referring to FIG. 3, when a metal oxide-based transparent electrode (e.g., indium tin oxide (ITO)), which is a light-transmitting electrode, is applied to, e.g., disposed on, the cathode 50, light formed in the active layer is emitted to the outside through the cathode 50 and the transparent substrate 100.

The aforementioned electronic device may be produced by a suitable method. For example, the electroluminescent device may be produced by forming a hole auxiliary layer (or an electron auxiliary layer) on a substrate on which an electrode is formed, forming an active layer including quantum dots (e.g., a pattern of the aforementioned quantum dots), and forming an electron auxiliary layer (or a hole auxiliary layer) and an electrode. The electrode, the hole auxiliary layer, and the electron auxiliary layer may each be independently formed by a suitable method, and may be formed, for example, by vapor deposition or coating, but are not particularly limited.

Other electronic devices including the aforementioned quantum dots may include a light source and a light emitting element. The light emitting element may include the aforementioned quantum dots, and the light source may be configured to provide incident light to the light emitting element. Such an electronic device may be a photoluminescent display device.

Incident light provided from the light source may have a photoluminescence peak wavelength in a range of greater than or equal to about 400 nm and less than or equal to about 500 nm, for example, greater than or equal to about 430 nm and less than or equal to about 480 nm. The light emitting element may have a form in which the aforementioned quantum dots are dispersed in a polymer matrix. For example, the light emitting element may be a quantum dot polymer composite implemented in a sheet form.

Figure 4:
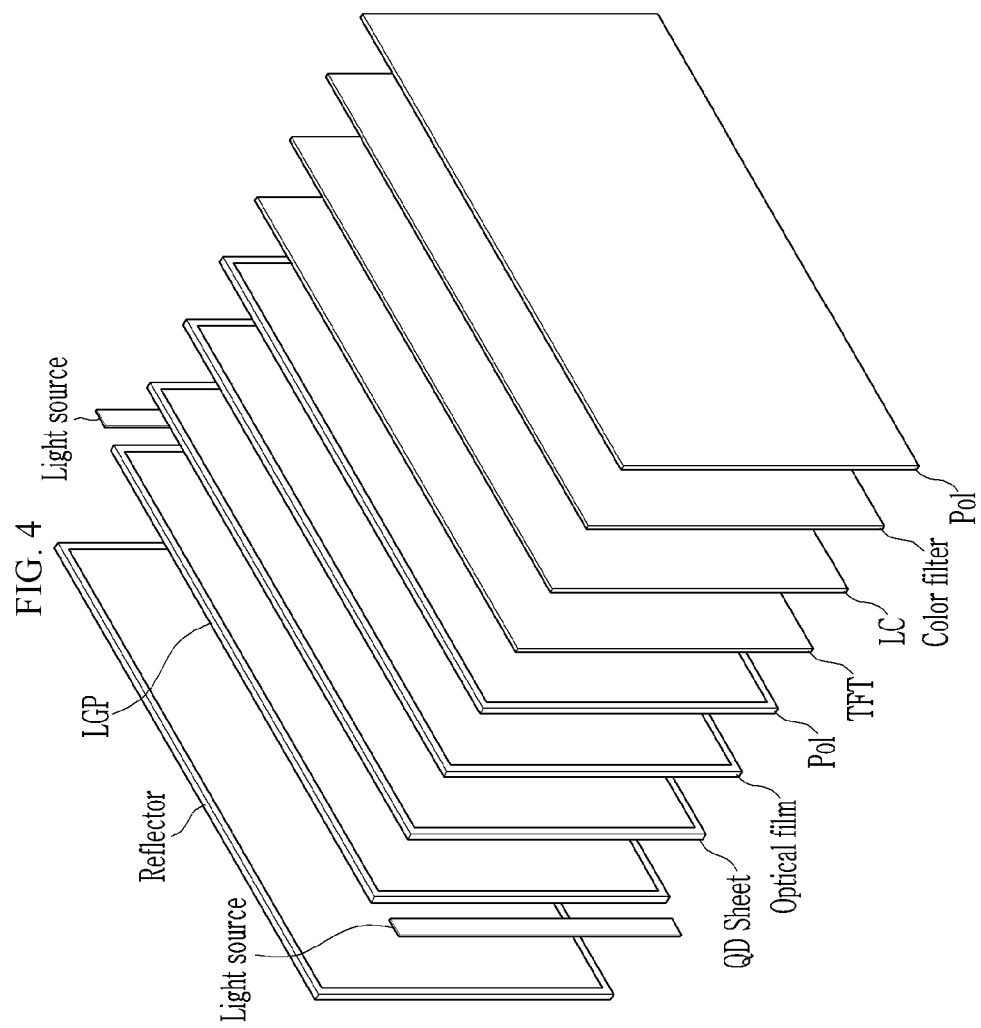
FIG. 4 is a schematic view of an electronic device according to an embodiment.

The photoluminescent display device according to an embodiment may further include a liquid crystal panel, and a sheet of a quantum dot polymer composite may be disposed between the light source and the liquid crystal panel. Referring to FIG. 4, a photoluminescent display device may include a backlight unit and a liquid crystal panel, and the backlight unit may include a quantum dot polymer composite sheet (QD sheet). For example, the backlight unit may have a stacked structure in which a reflector, a light guide plate (LGP), a light source (blue LED, etc.), a quantum dot polymer composite sheet (QD sheet), and an optical film (prism, double brightness enhancing film (DBEF), etc.). The liquid crystal panel is disposed on the backlight unit and may have a structure including a thin film transistor (TFT), liquid crystal (LC), and a color filter between two polarizers (Pol). The quantum dot polymer composite sheet (QD sheet) may include quantum dots emitting red light and quantum dots emitting green light by absorbing light from a light source. Blue light from the light source may be combined with red light and green light emitted from quantum dots and converted to white light by passing through the quantum dot polymer composite sheet. The white light may be separated to blue light, green light, and red light by a color filter in the liquid crystal panel and may be emitted to the outside in each pixel.

Figure 5A:
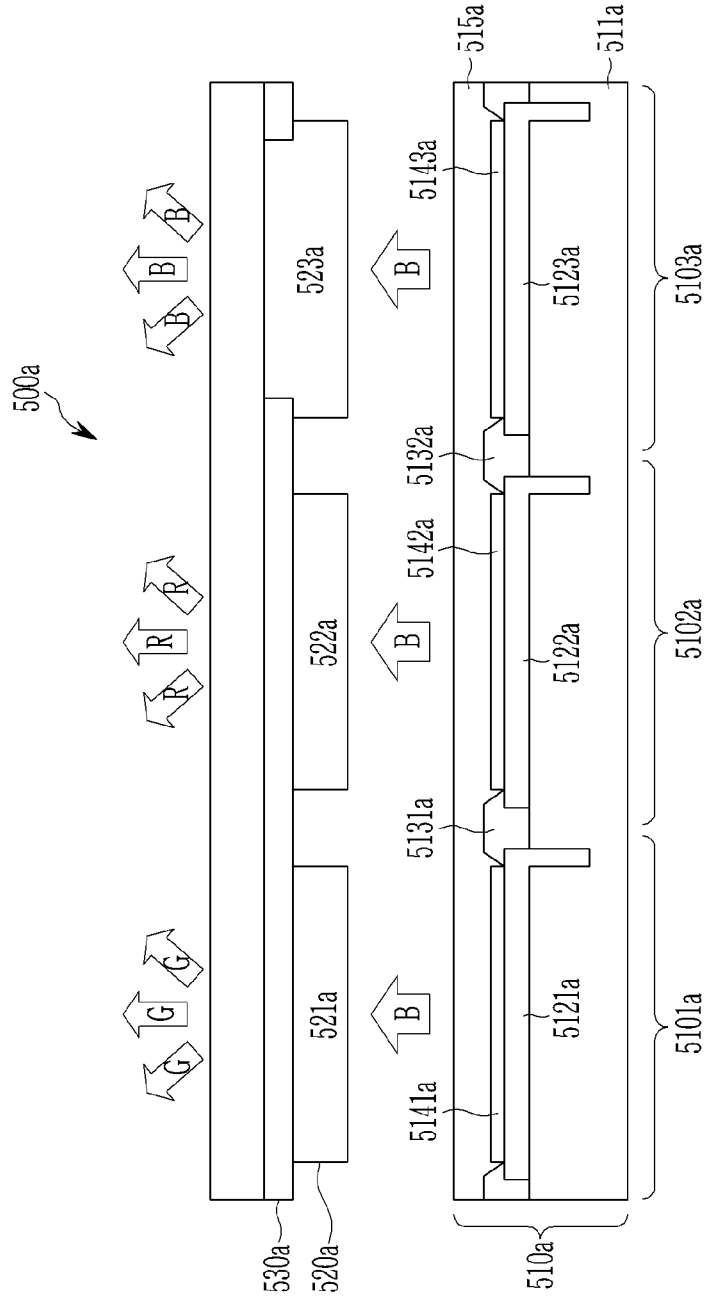
FIG. 5A is a schematic view showing an embodiment of an electronic device.
Figure 5B:
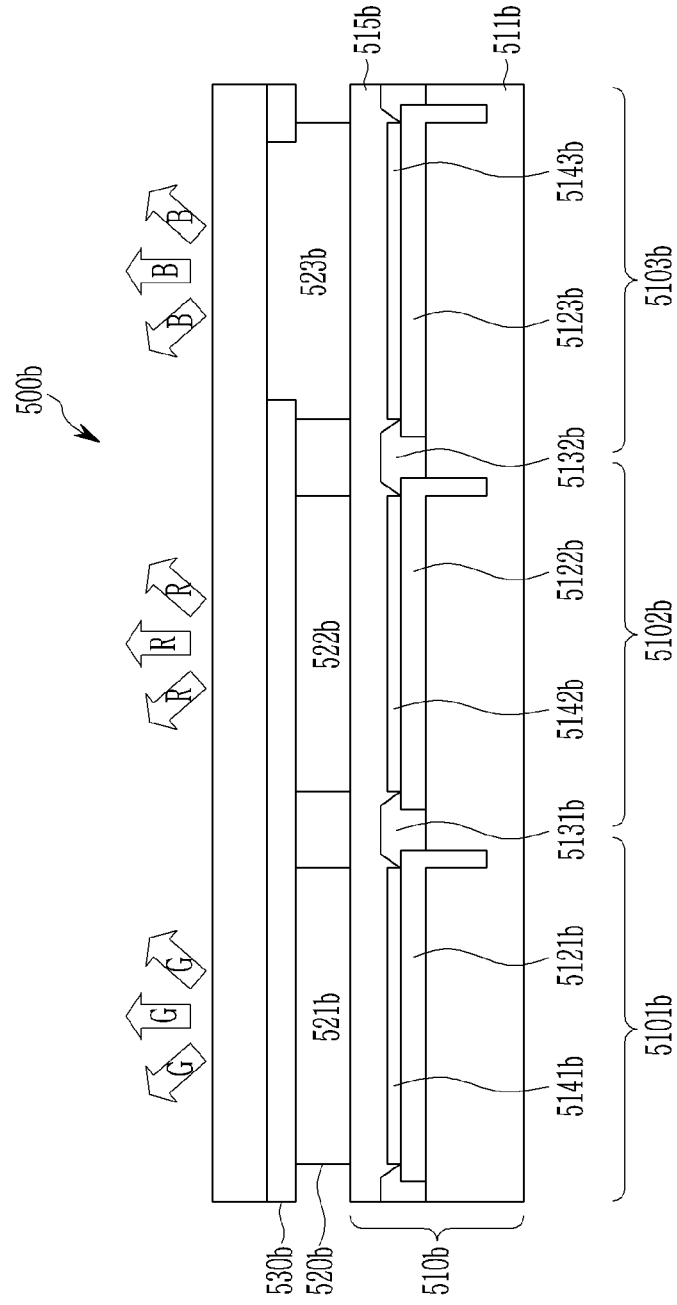
FIG. 5B is a schematic view showing an embodiment of an electronic device.

Another example of the photoluminescent display device may be a form of a quantum dot laminate structure in which the light emitting element is disposed on a substrate. The quantum dot laminate structure is as described above, and may have a quantum dot polymer composite pattern. For example, referring to FIGS. 5A and 5B, the photoluminescent display devices 500*a* and 500*b* may include the quantum dot polymer composite patterns 520*a* and 520*b* that face the light sources 510*a* and 510*b*. The quantum dot polymer composite pattern may include first sections 521*a* and 521*b* including green quantum dots and second sections 522*a* and 522*b* including red quantum dots and optionally, further include third sections 523*a* and 523*b* including no quantum dots. The quantum dot polymer composite pattern may be in contact with a light source (FIG. 5B) or disposed at a regular intervals (FIG. 5A). The light source may include a plurality of light emitting units 5101*a*, 5102*a*, 5103*a*, 5101*b*, 5102*b*, and 5103*b*, and a light emitting unit, e.g., at least one light emitting unit 5101*a*, 5102*a*, 5101*b*, and 5102*b* may be disposed to respectively correspond to each first and second section. If desired, a light emitting unit, e.g., at least one of light emitting units 5103*a* and 5103*b*, may be further disposed to correspond to a third section.

The light sources 510*a* and 510*b* may emit light at a predetermined wavelength (e.g., blue light, green light, or a combination thereof). For example, the light source may emit light having an emission peak wavelength within a range of greater than or equal to about 400 nm, greater than or equal to about 420 nm, or greater than or equal to about 430 nm and less than or equal to about 500 nm, less than or equal to about 490 nm, or less than or equal to about 480 nm.

The light sources 510*a* and 510*b* may be electroluminescent devices. For example, the light sources may include a first electrode and a second electrode facing each other and an electroluminescent layer disposed between the first electrode and the second electrode. For example, the light sources 510*a* and 510*b* may be organic light emitting diodes (OLED) including an organic light emitting material in an electroluminescent layer. The organic light emitting diode (OLED) may include at least two pixel electrodes 5121*a*, 5122*a*, 5123*a*, 5121*b*, 5122*b*, and 5123*b* formed on a substrate, pixel definition layers 5131*a*, 5132*a*, 5131*b*, and 5132*b* formed between at least two adjacent pixel electrodes, organic light emitting layers 5141*a*, 5142*a*, 5143*a*, 5141*b*, 5142*b*, and 5143*b* formed on each pixel electrode, and common electrode layers 515*a* and 515*b* formed on the organic light emitting layers. Under the organic light emitting diode (OLED), a thin film transistor (not shown) and substrates 511*a* and 511*b* may be disposed, e.g., present.

Light (e.g., blue light) emitted from the light sources enters the first sections and the second sections of the quantum dot polymer pattern and thus may be respectively converted into green light and red light. In addition, the blue light emitted from the light source may pass the third section including no quantum dot polymer pattern. The green light, red light, and blue light may be emitted to the outside for each pixel. For example, the first section emitting the green light may be a green pixel area, the second section emitting the red may be a red pixel area, and the third section emitting the blue light may be a blue pixel area.

The photoluminescent display device may include optical filter layers 530*a* and 530*b* in addition to the quantum dot polymer pattern. The optical filter layer may block light in a portion of the visible light region and transmit light in the remaining wavelength region. For example, the optical filter layers 530*a* and 530*b* may block blue light, which is in a wavelength region emitted from the light source but transmit light excluding the blue light (e.g., green light, red light, and/or yellow light which is a mixed color thereof). For example, the optical filter layers 530*a* and 530*b* may block greater than or equal to about 80%, greater than or equal to about 90%, or even greater than or equal to about 95% of light of greater than or equal to about 400 nm and less than about 480 nm but have greater than or equal to about 70%, greater than or equal to about 80%, greater than or equal to about 90%, or even greater than or equal to about 100% of light transmittance for the remaining light of greater than about 500 nm to less than or equal to 700 nm. The optical filter layers may improve color purity of a display device or increase the photoconversion efficiency of the quantum dot composite pattern.

The optical filter layers 530*a* and 530*b* may be disposed on the first sections 521*a* and 521*b* emitting green light and the second sections 522*a* and 522*b* emitting green light. The optical filter layers may not be disposed on portions corresponding to the third sections (blue pixel areas) 523*a* and 513*b* having no quantum dot polymer pattern. For example, the optical filter layers 530*a* and 530*b* may be formed as one structure on the remaining portions of the quantum dot polymer pattern except for the portions overlapped with the third sections. The optical filter layers 530*a* and 530*b* may be disposed apart each other where, e.g., and, overlapped with the first sections and the second sections of the quantum dot polymer pattern. For example, the optical filter layers have first regions and second regions respectively corresponding to the first sections and the second sections of the quantum dot polymer pattern, and the first regions and the second regions may be optically isolated by a black matrix and the like. The first regions of the optical filter layer may be disposed to corresponding to the first sections emitting green light (green pixel areas), block blue light and red light, and selectively transmit light within a predetermined wavelength range (e.g., greater than or equal to about 500 nm, greater than or equal to about 510 nm, or greater than or equal to about 515 nm and less than or equal to about 550 nm, less than or equal to about 540 nm, less than or equal to about 535 nm, less than or equal to about 530 nm, less than or equal to about 525 nm, or less than or equal to about 520 nm). In addition, the second regions of the second optical filter layer may be disposed to corresponding to the second sections emitting red light (red pixel areas), block blue light and green light, and selectively transmit light within a predetermined range (e.g., greater than or equal to about 600 nm, greater than or equal to about 610 nm, or greater than or equal to about 615 nm and less than or equal to about 650 nm, less than or equal to about 640 nm, less than or equal to about 635 nm, less than or equal to about 630 nm, less than or equal to about 625 nm, or less than or equal to about 620 nm).

The optical filter layers 530a and 530b may absorb a desired wavelength and thus block light of the corresponding wavelength. The optical filters may include a dye absorbing light of a wavelength to be blocked, a pigment absorbing light of a wavelength to be blocked, or a dye and a pigment each absorbing light of a wavelength to be blocked, and the dye, pigment, or dye and pigment may be disposed in the polymer matrix.

In addition, the optical filter layers 530a and 530b may reflect a desired wavelength and thus block light of the corresponding wavelength. The optical filter layers may include a plurality of layers (e.g., inorganic material layers) having a different refractive index. For example, the optical filter layers may be disposed in a form of alternately stacking two layers having different refractive indices (e.g., a layer having a high refractive index and a layer having a refractive index).

The photoluminescent display devices 500a and 500b may include an additional optical filter layer (not shown) further disposed between the light source and the light emitting element. The additional optical filter layer may reflect light (e.g., green light, red light, or green light and red light) emitted from the quantum dot polymer pattern but transmit light (e.g., blue light) emitted from the light source. For example, the optical filter layer may reflect greater than or equal to about 80%, greater than or equal to about 90%, or even greater than or equal to about 95% of the remaining light of greater than about 500 nm to less than or equal to about 700 nm but have light transmittance of greater than or equal to about 70%, greater than or equal to about 80%, greater than or equal to about 90%, or even greater than or equal to about 100% for light of greater than or equal to about 400 nm and less than about 480 nm. The additional optical filter layer may recycle red light, green light, and/or yellow light and increase photoconversion efficiency of the quantum dot composite pattern.

The photoluminescent display devices 500a and 500b may be manufactured by separately manufacturing a quantum dot laminate structure (the quantum dot polymer composite pattern) and the light source or directly forming the quantum dot polymer composite pattern on the light source.

Hereinafter, specific examples including the previously described quantum dots are presented.

EXAMPLES

The bandgap energies (Eg), lattice parameters, and electron/hole effective masses of the semiconductor compounds prepared in the following examples are shown in Table 1.

TABLE 1

| | Bandgap (electronvolts (eV)) | Lattice constant (nanometers (nm)) | Effective mass | |
|---|---|---|---|---|
| | | | Electron effective mass ($m_e$) | Hole effective mass ($m_e$) |
| ZnSe | 2.82 | 0.567 | 0.17 | 0.75 |
| ZnTe | 2.26 | 0.61 | 0.16 | 0.36 |
| ZnS (cubic) | 3.68 | 0.541 | 0.39 | 1.76 |
| Ga$_2$S$_3$ (cubic) | 3.43 | 0.52 | 0.19 | 0.8 |

*$m_e$: mass of free electrons ($9.1*10^{-31}$ kilograms (kg))

Quantum dots according to the following examples and comparative examples are analyzed according to the following method.

1. Photoluminescence Analysis

A photoluminescence (PL) spectrum of the nanocrystals is obtained at an irradiation wavelength of 372 nm by using a Hitachi F-7000 spectrometer.

2. Inductively Coupled Plasma (ICP) Analysis

Inductively coupled plasma atomic emission spectroscopy (ICP-AES) is performed by using Shimadzu ICPS-8100.

3. X-ray Photoelectron Spectroscopy (XPS)

X-ray photoelectron spectroscopy (Quantum2000, Physical Electronics, Inc.) is used to perform an XPS analysis.

The synthesis is conducted under an inert gas atmosphere (under a nitrogen flowing condition) unless otherwise specified.

Reference Example 1: Synthesis of ZnTeSe Quantum Dot (core)

Selenium and tellurium are respectively dispersed in trioctylphosphine (TOP) to prepare a 0.4 molar (M; moles per liter) Se/TOP stock solution and a 0.5 M Te/TOP stock solution. The Te/TOP stock solution and an oleylamine organic ligand are mixed to prepare a mixed solution.

In a 300 milliliter (mL) reaction flask, 0.9 millimoles (mmol) of zinc acetate is dissolved with oleic acid in 1-octadecene and then, heated at 120° C. under vacuum. After 1 hour, an atmosphere in a reactor is converted into inert gas and then, heated at 300° C.

Subsequently, the Se/TOP stock solution and the mixed solution are injected into the heated reaction system, completing the reaction.

The reaction system is cooled down to room temperature, acetone is added thereto to form precipitates, and the precipitates are centrifuged to obtain ZnTeSe quantum dots. The obtained ZnTeSe quantum dots are dispersed in toluene.

Example 1: Synthesis of ZnTeSe/GaS$_x$ Core-Shell Quantum Dots

1. A ZnTeSe core is prepared according to the same method as Reference Example 1.
2. Sulfur is dispersed in trioctylphosphine (TOP) to prepare a 1 M S/TOP stock solution. In a 300 mL reaction flask, gallium stearate is dissolved with oleic acid in trioctylamine and then, heated at 120° C. under vacuum. After 1 hour, an atmosphere in the reactor is converted into inert gas and then, heated at greater than or equal to 200° C. In the heated reaction system, the ZnTeSe core synthesis in the first step and the S/TOP stock solution are put, and then, an abnormal reaction is performed for about 5 minutes. Herein, gallium stearate and S/TOP are used in a mole ratio of 1:1. When the reaction is complete, the reaction system is cooled down to room temperature, acetone is added thereto to form precipitates, and the precipitates are centrifuged to obtain ZnTeSe/GaS$_x$ core-shell quantum dots. The obtained core-shell quantum dots are dispersed in toluene.

Figure 6:
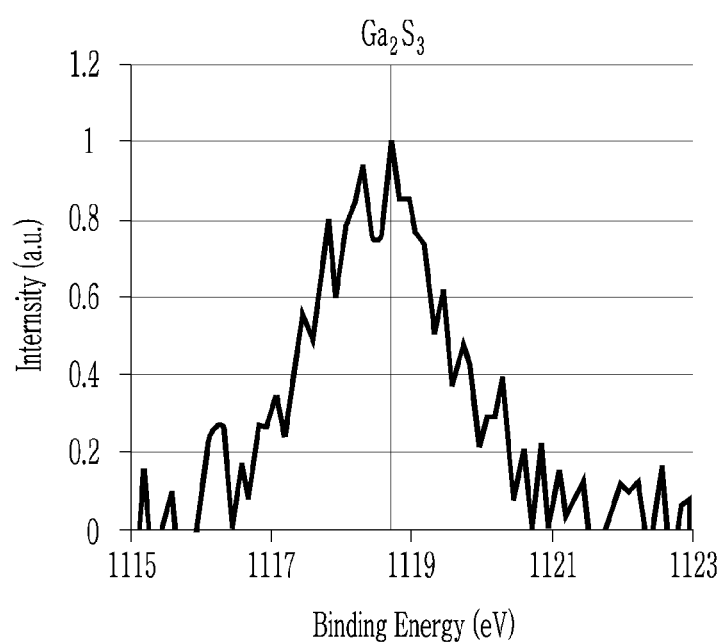
FIG. 6 is a graph of intensity (arbitrary units (a.u.)) versus binding energy (electronvolts (eV)) showing an X-ray photoelectron spectroscopy (XPS) analysis result of the quantum dot prepared in Example 1.

An XPS analysis is performed with respect to the synthesized core-shell quantum dots in Example 1, and the results are shown in FIG. 6. Referring to FIG. 6, the quantum dots according to Example 1 have a peak corresponding to Ga$_2$S$_3$.

An ICP analysis is performed with respect to the synthesized quantum dots (cores) according to Reference Example 1 and the synthesized core-shell quantum dots according to Example 1, and the results are shown in Table 2.

TABLE 2

| | | ICP (mole ratio) | | | | |
|---|---|---|---|---|---|---|
| | | Te:Te | S:Te | Zn:Te | Se:Te | Ga:Te |
| Reference Example 1 | ZnTeSe | 1:1 | 0:1 | 3.61:1 | 1.03:1 | 0:1 |
| Example 1 | ZnTeSe/GaS$_x$ | 1:1 | 1.17:1 | 3.68:1 | 0.94:1 | 0.9:1 |

Comparative Example 1: Synthesis of ZnTeSe/ZnS Core-Shell Quantum Dots

ZnTeSe/ZnS core-shell quantum dots are obtained according to the same method as Example 1 except that 0.9 mmol of zinc acetate is used instead of gallium stearate in the second step of Example 1.

A photoluminescence analysis is performed with respect to the synthesized quantum dots according to Reference Example 1, Comparative Example 1, and Example 1, and the obtained results (an emission peak wavelength, a full width at half maximum (FWHM), quantum efficiency) are shown in Table 3.

The quantum dots according to Example 1 exhibit improved luminescent properties (for example, quantum efficiency) compared with the quantum dots according to Reference Example 1 and Comparative Example 1. For example, the quantum dot including a Group II-VI semiconductor nanocrystal core and a Group III-VI semiconductor nanocrystal shell (a core-shell quantum dot with a shell having an effective mass of 2.0 times or less than an effective mass of a core) according to Example 1 has a quantum efficiency that is about 1.5 times or more greater than the quantum dot (core) with a Group II-VI semiconductor nanocrystal according to Reference Example 1 and the quantum dot with a Group II-VI semiconductor nanocrystal core and a Group II-VI semiconductor nanocrystal shell (core-shell quantum dot with a shell having an effective mass that is 2.0 times greater than an effective mass of a core) according to Comparative Example 1.

TABLE 3

| | | Emission peak wavelength (nm) | Full width at half maximum (FWHM) (nm) | Quantum efficiency (Quantum Yield (QY), %) |
|---|---|---|---|---|
| Reference Example 1 | ZnTeSe | 512 | 25 | 27.4 |
| Comparative Example 1 | ZnTeSe/ZnS | 516 | 27 | 25 |
| Example 1 | ZnTeSe/GaS$_x$ | 515 | 25.7 | 40.5 |

Example 2: Synthesis of ZnTeSe/ZnSe/GaS$_x$ Quantum Dots

1. A ZnTeSe core is manufactured in the same method as the first step of Example 1.
2. Selenium (Se) is dispersed in trioctylphosphine (TOP) to prepare a 1 M Se/TOP stock solution. In a 300 mL reaction flask, 0.9 mmol of zinc acetate with oleic acid is dissolved in trioctylamine and then, heated at 120° C. under vacuum.

After 1 hour, an atmosphere in the reactor is converted into inert gas, and the reactor is heated at greater than or equal to 200° C. In the reaction system, the S/TOP stock solution synthesized in the first step is put to perform an abnormal reaction for about 5 minutes. When the reaction is complete, the reaction system is cooled down to room temperature, acetone is added there to obtain precipitates, and the precipitates are centrifuged to prepare ZnTeSe/ZnSe.
3. A ZnTeSe/ZnSe/GaS$_x$ core-shell quantum dot is obtained according to the same method as the second step of Example 1 except that ZnTeSe/ZnSe is used instead of the ZnTeSe core.

Comparative Example 2: Synthesis of ZnTeSe/ZnSe/ZnS Quantum Dots

1. The same ZnTeSe/ZnSe as the first and second steps of Example 2 is prepared.
2. Sulfur is dispersed in trioctylphosphine (TOP) to prepare a 1 M S/TOP stock solution. In a 300 mL reaction flask, 0.9 mmol of zinc acetate with oleic acid is dissolved in trioctylamine and then, heated at 120° C. under vacuum. After 1 hour, an atmosphere in the reactor is converted into inert gas and then, heated at greater than or equal to 200° C. In the heated reaction system, the synthesized ZnTeSe/ZnSe in the first step and the S/TOP stock solution are put to perform an abnormal reaction for about 5 minutes. When the reaction is complete, the reaction system is cooled down to room temperature, acetone is added thereto to form precipitates, and the precipitates are centrifuged to obtain ZnTeSe/ZnSe/ZnS core-shell quantum dots. The obtained core-shell quantum dots are dispersed in toluene.

Example 3: Synthesis of ZnTeSe/ZnSe/ZnS/GaS$_x$ Quantum Dots

1. ZnTeSe/ZnSe/ZnS is prepared according to the same method as Comparative Example 2.
2. ZnTeSe/ZnSe/ZnS/GaS$_x$ core-shell quantum dots are obtained according to the same method as the second step of Example 1 except that the synthesized ZnTeSe/ZnSe/ZnS in the first step is used instead of the ZnTeSe core.

Example 4: Synthesis of ZnTeSe/ZnSe/ZnS/GaS$_x$/ZnS Quantum Dots

1. ZnTeSe/ZnSe/ZnS/GaS$_x$ is prepared according to the same method as Example 3.
2. ZnTeSe/ZnSe/ZnS/GaS$_x$ core-shell quantum dots are obtained according to the same method as the second step of Comparative Example 2 except that the synthesized ZnTeSe/ZnSe/ZnS/GaS$_x$ in the first step is used instead of the ZnTeSe/ZnSe.

A photoluminescence analysis is performed with respect to the core-shell quantum dots according to Comparative Example 2 and Examples 2, 3, and 4, and the obtained results (an emission peak wavelength, a FWHM, quantum efficiency) are shown in Table 4. Table 4 also shows that a mole ratio of a semiconductor compound (ZnTeSe, ZnSe, and $GaS_x$) having an electron effective mass of less than or equal to about 0.34 $m_e$ by using the amounts of precursors used in the quantum dots according to Comparative Example 2 and Examples 2, 3, and 4 to calculate the amount of the semiconductor compound included in the core-shell quantum dots. Herein, an electron effective mass ($m^*_e$) of the semiconductor compound included in the quantum dots is shown in Table 1.

TABLE 4

|  |  | Mole ratio of semiconductor compound having $m^*_e \leq 0.34$ $m_e$ | Emission peak wavelength (nm) | Full width at half maximum (FWHM (nm)) | Quantum efficiency (QY, %) |
|---|---|---|---|---|---|
| Comparative Example 2 | ZnTeSe/ZnSe/ZnS | 0.296:1 | 519 | 23.8 | 44.9 |
| Example 2 | ZnTeSe/ZnSe/$GaS_x$ | 1.0:1 | 520 | 25 | 72 |
| Example 3 | ZnTeSe/ZnSe/ZnS/$GaS_x$ | 0.56:1 | 519 | 23.8 | 53.4 |
| Example 4 | ZnTeSe/ZnSe/ZnS/$GaS_x$/ZnS | 0.37:1 | 521 | 24.7 | 65.5 |

Figure 7:
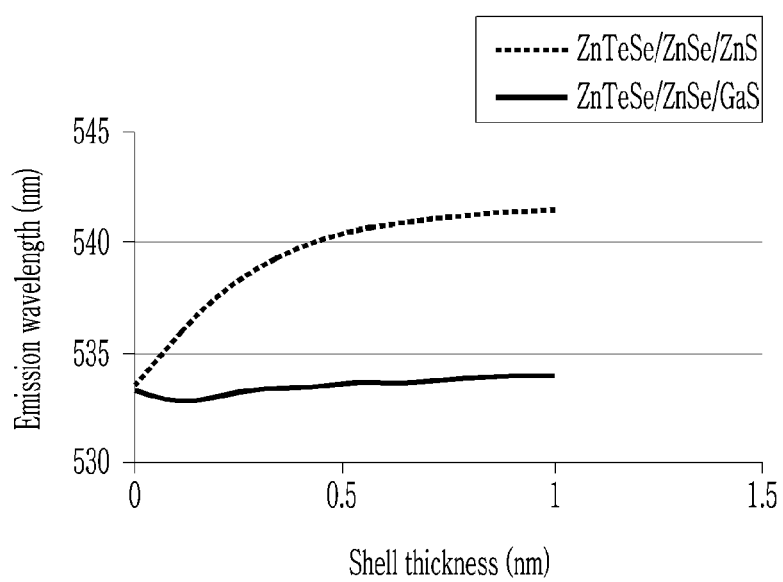
FIG. 7 is a graph of emission wavelength (nanometers (nm)) versus shell thickness (nm) of the GaSx shell and the ZnS shell in ZnTeSe/ZnSe/GaS$_x$ of Example 2 and ZnTeSe/ZnSe/ZnS of Comparative Example 2.

Referring to the results of Table 4, the quantum dots of the example embodiments exhibit improved luminescent properties (for example, quantum efficiency) compared with the quantum dots of the comparative example. For example, the quantum dots including a Group II-VI semiconductor nanocrystal core (ZnTeSe core) and a Group III-VI semiconductor nanocrystal shell ($GaS_x$ shell) according to Examples 2, 3, and 4 have a FWHM of less than or equal to 30 nm and also about 1.2 times as high quantum efficiency as the quantum dot including no Group III-VI semiconductor nanocrystal shell according to Comparative Example 2. In addition, referring to the results of Tables 3 and 4, Examples 2, 3, and 4 further including a third nanocrystal semiconductor shell (Group II-VI semiconductor nanocrystal shell) as well as the Group III-VI semiconductor nanocrystal shell have about 1.2 times as high quantum efficiency as Example 1. In addition, referring to FIG. 7, a quantum dot including semiconductor compound having an electron effective mass of less than or equal to 0.34 $m_e$ in a high mole ratio (e.g., greater than or equal to 0.3:1) may emit light of a desired wavelength. For example, in a quantum dot with a ZnTeSe/ZnSe/ZnS structure, as a result of simulating an emission peak wavelength of the quantum dot depending on a thickness of a ZnS shell (an amount of ZnS), as the thickness of the ZnS shell is larger (as the amount of ZnS is larger), that is, as the mole ratio of the semiconductor compound having an electron effective mass of less than or equal to about 0.34 $m_e$ is lower, e.g., decreased, the emission peak wavelength of the quantum dot is greatly changed. However, in the quantum dot with the ZnTeSe/ZnSe/$GaS_x$ structure, as a result of simulating an emission peak wavelength of the quantum dot depending on a thickness (amount) of a $GaS_x$ shell, even though the thickness of the $GaS_x$ shell is larger (even though the amount of $GaS_x$ is increased), that is, even though the mole ratio of the semiconductor compound having an electron effective mass of less than or equal to 0.34 $m_e$, an emission peak wavelength of the quantum dot is not substantially changed. Without being bound by any particular theory, it is believed that since the quantum dot with the ZnTeSe/ZnSe/$GaS_x$ structure has higher electron density than a quantum dot with a ZnTeSe/ZnSe/ZnS structure, electrons-holes may be overlapped to a higher degree.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A quantum dot polymer composite, comprising
a polymer matrix; and
quantum dots dispersed in the polymer matrix;
wherein the quantum dots comprise
a semiconductor compound having an electron effective mass of less than or equal to about 0.34 $m_e$ is present in a mole ratio of greater than or equal to about 0.3:1 and less than or equal to about 1.0:1 relative to a total number of moles in the quantum dots,
wherein the quantum dots do not comprise cadmium, lead, mercury, or a combination thereof.

2. The quantum dot polymer composite of claim 1, wherein the semiconductor compound having the electron effective mass of less than or equal to about 0.34 $m_e$ comprises a Group II-VI compound, a Group III-V compound, a Group III-VI compound, or a combination thereof.

3. The quantum dot polymer composite of claim 1, wherein the semiconductor compound having the electron effective mass of less than or equal to about 0.34 $m_e$ comprises a compound $M^4X^4$, wherein $M^4$ is Zn, Ga, or a combination thereof, and $X^4$ is S, Se, Te, or a combination thereof.

4. The quantum dot polymer composite of claim 1, wherein the semiconductor compound having the electron effective mass of less than or equal to about 0.34 $m_e$ comprises zinc selenide, zinc telluride, gallium sulfide, or a combination thereof.

5. The quantum dot polymer composite of claim 1, wherein the semiconductor compound having the electron effective mass of less than or equal to about 0.34 $m_e$ is not a binary element compound of zinc sulfide.

6. The quantum dot polymer composite of claim 1, wherein
the quantum dots comprise
a core comprising a semiconductor nanocrystal; and
n shells disposed outside the core,
wherein n is an integer greater than or equal to 1, and
wherein at least one of the n shells comprises the semiconductor compound having the electron effective mass of less than or equal to about 0.34 $m_e$.

7. The quantum dot polymer composite of claim 6, wherein the core comprising the semiconductor nanocrystal comprises a semiconductor compound having an electron effective mass of less than or equal to about 0.34 $m_e$.

8. The quantum dot polymer composite of claim 6, wherein the core comprising the semiconductor nanocrystal comprises a zinc chalcogenide compound.

9. The quantum dot polymer composite of claim 6, wherein
n is an integer greater than or equal to 2, and
a number m of the n shells comprise a semiconductor compound having an electron effective mass of less than or equal to about 0.34 $m_e$, wherein m is an integer greater than or equal to n/2.

10. The quantum dot polymer composite of claim 6, wherein the quantum dots further comprise a shell comprising a binary element compound of zinc sulfide.

11. An electronic device comprising
a quantum dot comprising
a semiconductor compound having an electron effective mass of less than or equal to about 0.34 $m_e$ is present in a mole ratio of greater than or equal to about 0.3:1 and less than or equal to about 1.0:1 relative to a total number of moles in the quantum dot,
wherein the quantum dot does not comprise cadmium, lead, mercury, or a combination thereof.

12. The electronic device of claim 11, wherein the electronic device comprises
a light source; and
a light emitting element,
wherein the light emitting element comprises the quantum dot, and
wherein the light source is configured to provide incident light to the light emitting element.

13. The electronic device of claim 11, wherein
the electronic device comprises
a first electrode;
a second electrode facing the first electrode; and
an active layer between the first electrode and second electrode,
wherein the active layer comprises the quantum dot.

14. The electronic device of claim 11, wherein the semiconductor compound having the electron effective mass of less than or equal to about 0.34 $m_e$ comprises a Group II-VI compound, a Group III-V compound, a Group III-VI compound, or a combination thereof.

15. The electronic device of claim 11, wherein the semiconductor compound having the electron effective mass of less than or equal to about 0.34 $m_e$ comprises a compound $M^4X^4$, wherein $M^4$ is Zn, Ga, or a combination thereof, and $X^4$ is S, Se, Te, or a combination thereof.

16. The electronic device of claim 11, wherein the semiconductor compound having the electron effective mass of less than or equal to about 0.34 $m_e$ comprises zinc selenide, zinc telluride, gallium sulfide, or a combination thereof.

17. The electronic device of claim 11, wherein
the quantum dot comprises
a core comprising a semiconductor nanocrystal; and
n shells disposed outside the core,
wherein n is an integer greater than or equal to 1, and
wherein at least one of the n shells comprises the semiconductor compound having the electron effective mass of less than or equal to about 0.34 $m_e$.

18. The electronic device of claim 17, wherein the core comprising the semiconductor nanocrystal comprises a semiconductor compound having an electron effective mass of less than or equal to about 0.34 $m_e$.

19. The electronic device of claim 17, wherein the core comprising the semiconductor nanocrystal comprises a zinc chalcogenide compound.

20. An electronic apparatus comprising a quantum dot comprising
a semiconductor compound having an electron effective mass of less than or equal to about 0.34 $m_e$ is present in a mole ratio of greater than or equal to about 0.3:1 and less than or equal to about 1.0:1 relative to a total number of moles in the quantum dot,
wherein the quantum dot does not comprise cadmium, lead, mercury, or a combination thereof.

* * * * *